United States Patent [19]

Nishiyama et al.

[11] Patent Number: 5,255,607
[45] Date of Patent: Oct. 26, 1993

[54] METHOD AND APPARATUS FOR MAINTAINING REGISTRATION WHEN MAKING A PRINTING PLATE

[75] Inventors: Mikio Nishiyama; Hirokazu Okutsu, both of Kanagawa, Japan

[73] Assignee: Fuji Photo Film Co., Ltd., Kanagawa, Japan

[21] Appl. No.: 811,111

[22] Filed: Dec. 20, 1991

[30] Foreign Application Priority Data

Dec. 21, 1990 [JP] Japan ................ 2-405222
Feb. 8, 1991 [JP] Japan ................ 3-017768

[51] Int. Cl.⁵ .................. B41N 1/14; G03F 7/26
[52] U.S. Cl. ................... 101/463.1; 101/481; 101/486; 101/DIG. 36; 430/309; 355/85; 33/617
[58] Field of Search ........... 101/463.1, 465, 466, 101/467, 481, 485, 486, DIG. 36; 430/49, 309, 310; 355/85, 86, 87; 33/620, 614, 617

[56] References Cited

U.S. PATENT DOCUMENTS

| | | | |
|---|---|---|---|
| 3,771,440 | 11/1973 | Eburn, Jr. ................ | 72/294 X |
| 3,981,583 | 9/1976 | Tsuchida et al. .......... | 355/85 X |
| 4,149,798 | 4/1979 | McGowan et al. ......... | 430/49 X |
| 4,573,406 | 3/1986 | Cleemput et al. ......... | 33/617 X |
| 4,594,868 | 6/1986 | Takeuchi et al. ......... | 72/294 X |
| 4,729,310 | 3/1988 | Love, III ................ | 101/170 X |
| 4,809,609 | 3/1989 | Sugiura et al. ........... | 101/485 |
| 4,833,985 | 5/1989 | Kojima et al. ............ | 101/DIG. 36 |

Primary Examiner—Edgar S. Burr
Assistant Examiner—Stephen R. Funk
Attorney, Agent, or Firm—Sughrue, Mion, Zinn, Macpeak & Seas

[57] ABSTRACT

A printing plate making apparatus for color printing is provided with a depicting section for recording an image on the surface of a printing plate, a processing section for processing the printing plate, with a processing solution, while conveying the printing plate, and a punching section for punching notches for positioning and winding the printing plate around a plate cylinder of a rotary press, the depicting and punching sections are provided with a first reference pin for abutting against a side edge of the printing plate being moved in a first direction to position the printing plate in the first direction, and a second reference pin for abutting against a side edge of the printing plate being moved in a second direction to position the printing plate in the second direction. The positional relation between the first and second reference pins in the depicting section and the positional relation between the first and second reference pins in the punching section are set identically. Therefore, positioning notches for the rotary press can be punched after the printing plate has been processed.

29 Claims, 27 Drawing Sheets

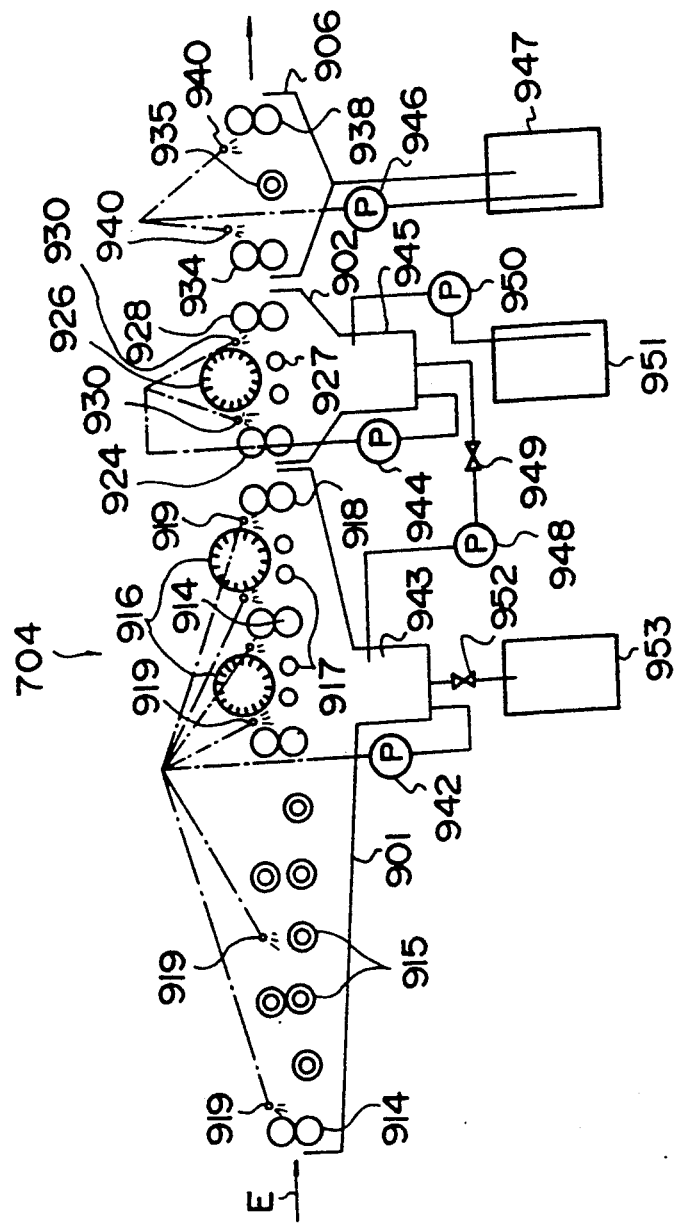

METHOD AND APPARATUS FOR MAINTAINING REGISTRATION WHEN MAKING A PRINTING PLATE

BACKGROUND OF THE INVENTION

1. Field of the Invention

The present invention relates to method and apparatus for making a printing plate.

2. Description of the Related Art

In the case of a printing plate for color printing which is used in printing a newspaper with an offset rotary press, accuracy of the image position on the printing plate must be higher than the accuracy (±0.5 mm., approx.) of the image position on a printing plate for monochromic printing, from the viewpoint of the reference position which is required for positioning and winding these printing plates around a plate cylinder of a rotary press. For the printing plate for color printing the differences between the four colors, that is, yellow (Y), magenta (M), cyan (C), and black (BK) must be set within ±30 μm. Accordingly, in the process of recording or depicting an image where the first positioning is required, the printing plate for color printing is depicted or recorded with an image and punched to form positioning notches and holes simultaneously so that the positioning notches and holes can be punched in both lengthwise end portions of the printing plate for color printing. In the subsequent processes where positionings are required, for example, the process of bending the printing plate for color printing with a bending device and the process of winding the printing plate around the plate cylinder of the rotary press, register pins are inserted into these notches. As a result, accurate positioning can be performed and a high precision can be obtained in color printing with the above four colors.

However, in a direct printing plate making system such as a direct plate printing recorder called a DPPR or a digital direct plate printing called a DDPP, after a printing plate coated with an organic photoconductor (hereinafter referred to as an OPC plate material) is subject to the recording process, that is, after it is subjected to a depicting process with a laser beam, this printing plate is, while being conveyed in its lengthwise direction, subject to a developing process with a liquid toner, the heating and fixing process, and then, an etching process in the non-imaging area of the plate. In the developing process, if the OPC plate material has the above-described notches, a developing solution will flow irregularly at the notches in the forward portion in the conveying direction of the OPC plate material, and poor development will occur.

In order to prevent such poor development, for example, if the recorded and notched OPC plate material is conveyed widthwise during the developing process, the length at a right angle to the advancing direction becomes too long. For example, in the case of a printing plate of two pages, its length is about 1,100 mm, and its width is about 400 mm. Accordingly, there is a problem in that it is difficult to uniformly develop the entire OPC plate material lengthwise.

Similarly, in a system for making a photosensitive lithographic printing plate, if a printing plate is not accurately positioned in the printing, i.e., image-recording or depicting, punching, and bending processes, the accuracy of the image position is lowered. There is a problem that may cause a shear between colors in color printing. Also, in this case, the image-recorded printing plate is developed while being conveyed. If this printing plate is also subject to the punching process during the printing or recording process, developing solution will flow irregularly at positioning notches, and the developing process will become unstable.

Further, in a system for making a printing plate for monochromic printing, if a printing plate is subjected to punching notches in an image-recording or depicting process for recording an image on the printing plate, developing solution will flow irregularly at the notches in the subsequent developing process, which will result in poor development in the same manner as the above-described systems.

In view of the above problems, one object of the present invention is to provide a method and an apparatus for making a printing plate wherein the developing solution flows regularly on the printing plate so that a stable developing process can be carried out.

Another object of the present invention is to provide a method and an apparatus for making a printing plate for color printing whereby high precision of color printing can be attained without punching notches and holes for insertion of register pins during the recording process such as depicting.

SUMMARY OF THE INVENTION

In accordance with the present invention, a printing plate making method includes the steps of: recording an image on a printing surface of a printing plate, processing the printing plate with a processing solution while conveying the printing plate on which the image has been recorded, punching notches for positioning and winding the processed printing plate around the plate cylinder of a rotary press, and bending the punched printing plate for winding the printing plate around the plate cylinder.

In the above arrangement of the present invention, in the recording step, the image is recorded on the surface of the printing plate. In the processing step, the printing plate is processed with the processing solution. Then, in the punching step, the printing plate is punched so as to form the notches used in positioning and winding the printing plate around the plate cylinder of the rotary press. In the bending step, the printing plate is bent so that it can be wound around the plate cylinder. In this manner, the punching step is provided following the processing step. Therefore, the printing plate being conveyed in the processing step has no notches, and the processing solution does not flow irregularly, so that a stable development can be effected. In the present method a photosensitive lithographic printing plate can be used as the printing plate and this method can be applied to both a printing plate making method for color printing and that for monochromic printing.

A printing plate making apparatus in accordance with the present invention, includes a recording section having a first positioning device for positioning a printing plate and recording an image on the surface of the printing plate positioned by the first positioning device, a processing section for processing the printing plate, on which the image has been recorded, with a processing solution while conveying it; and a punching section having a second positioning device for positioning the processed printing plate and punching notches, used in positioning and winding the printing plate around the plate cylinder of a rotary press, on the printing plate positioned by the second positioning device.

The first positioning device has a first reference member for abutting against a side edge of the printing plate being moved in a first direction and positioning the printing plate in the first direction, and a second reference member for abutting against a side edge of the printing plate being moved in a second direction right-angled to the first direction and positioning this printing plate in the second direction. The second positioning device has a third reference member for abutting against a side edge of the printing plate being moved in a third direction and positioning this printing plate in the third direction, and a fourth reference member for abutting against a side edge the printing plate being moved in a fourth direction right-angled to the third direction and positioning this printing plate in the fourth direction. The positional relation between the first and second reference members is set the same as the positional relation between the third and fourth reference members.

In the above-described printing plate making apparatus, the printing plate is positioned by the first positioning device in the recording section, and then an image is recorded on the printing surface of the printing plate. The printing plate on which the image has been recorded is processed in the processing section while being conveyed. The processed printing plate is positioned by the second positioning device in the punching section, and then the notches are punched to position and wind the printing plate around the plate cylinder of the rotary press. In the recording section, prior to recording the image, the printing plate being moved in the first direction is caused to abut against the first reference member, so that the first-directional positioning of the printing plate is performed, and then the printing plate being moved in the second direction is caused to abut against the second reference member, so that the second-directional positioning of the printing plate is performed. In addition, in the punching section, prior to punching, the printing plate being moved in the third direction is caused to abut against the third reference member, so that the third-directional positioning of the printing plate is performed, and then the printing plate being moved in the fourth direction is caused to abut against the fourth reference member, so that the fourth-directional positioning of the printing plate is performed. Since the positional relation between the first and second reference members in the recording section is set the same as the positional relation between the third and fourth reference members in the punching section, the position of the abutment of the first reference member against the printing plate becomes the same as the position of the abutment of the third reference member against the printing plate, and the position of the abutment of the second reference member against the printing plate becomes the same as position of the abutment of the fourth reference member against the printing plate. That is, the relative position of the image recorded on the printing surface of the printing plate in the recording section to the first and second reference members becomes the same as the relative position of the image on the printing surface of the printing plate in the punching section to the third and fourth reference members. Accordingly, in both the recording and the punching sections, the positioning of the printing plate, i.e., the image, is performed with high accuracy to each other. As a result, it is unnecessary to conduct the image recording and punching for positioning and winding the printing plate around the plate cylinder of the rotary press in the recording section. A processing solution such as developing solution does not flow irregularly because the printing plate being conveyed in the processing section has no notches.

The present invention can be applied to both a printing plate making apparatus for monochromic printing and that for color printing. Particularly, in case that the present invention is applied to the latter, a high precision of color printing can be obtained without punching in the recording section.

Further, the recording section may comprise a charging device for electrically charging the printing plate, and a depicting device for recording the image as an electrostatic latent image on the printing plate by scanning with a laser beam.

As described above, in accordance with the printing plate making method and apparatus of the present invention, in the recording section, that is, the depicting section, the notches for positioning and winding the printing plate around the plate cylinder of the rotary press are not needed to be punched on the printing plate. Therefore, an excellent effect can be obtained in that poor development will not occur because of irregular flow of processing solution such as developing solution in the developing portion.

Reference pins can be used as the first, second, third, and fourth reference members. In addition, the first direction can be set substantially the same as the third direction, while the second direction can be set substantially the same as the fourth direction.

BRIEF DESCRIPTION OF THE DRAWINGS

FIG. 29 is a side view of a processing section of the photosensitive lithographic printing plate making apparatus in accordance with the second embodiment.

DETAILED DESCRIPTION OF THE PREFERRED EMBODIMENT

Referring to FIGS. 1 to 29, a detailed description will be given of the embodiments of the present invention.

Figure 1:
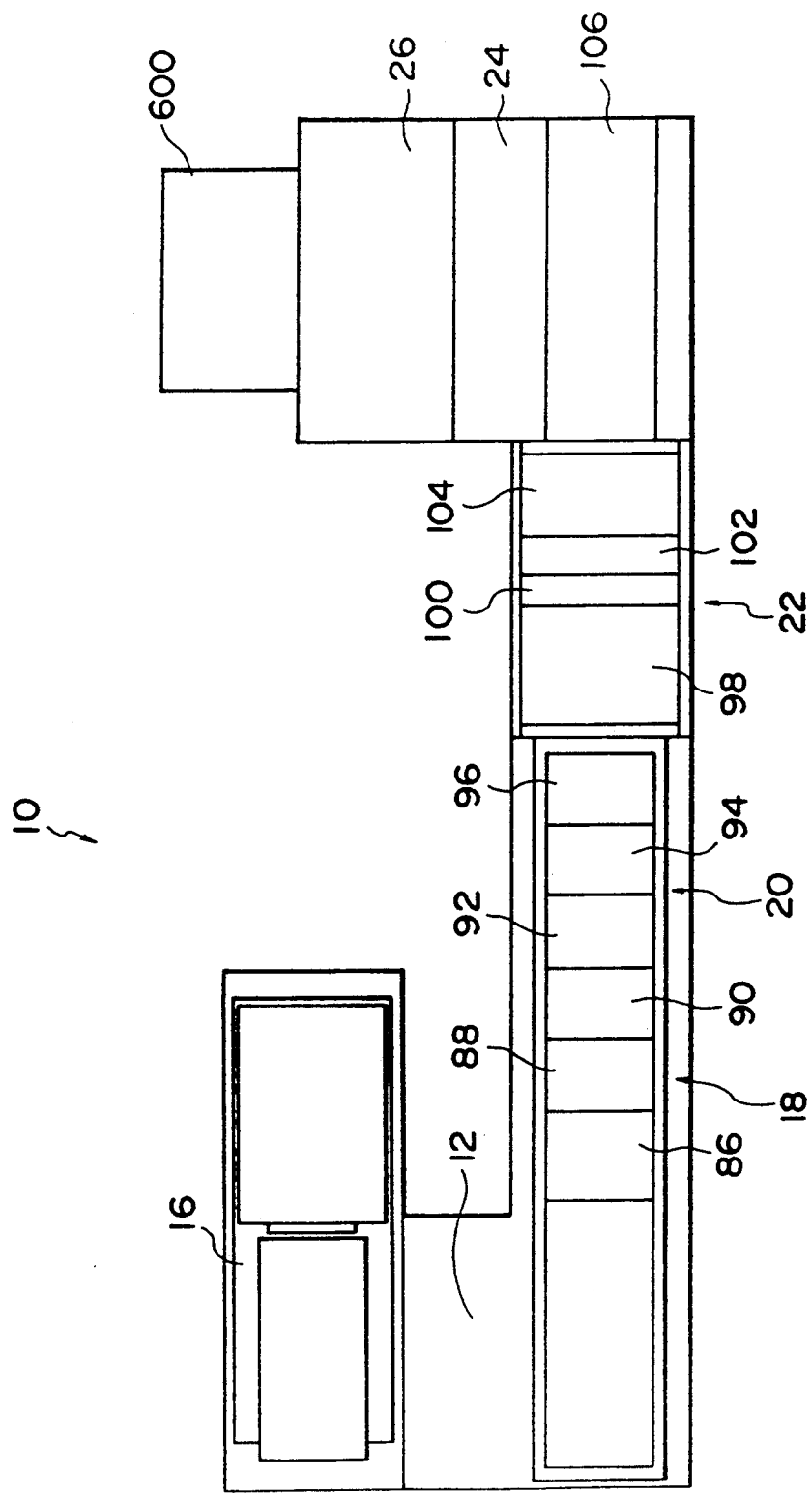
FIG. 1 is a schematic illustration of a printing plate direct making apparatus in accordance with the first embodiment of the present invention.

Referring now to FIG. 1, a first embodiment of the present invention will be shown as a schematic view.

A direct printing plate making apparatus for color printing 10 comprises a plate supplying section 12, a depicting section 16 that records an image on a supplied printing plate 14, a developing process section 18 that develops the depicted printing plate 14, a fixing process section 20 that fixes the developed printing plate 14, an etching section 22 that etches the fixed printing plate 14, a punching section 24 that punches notches on the etched printing plate 14, the notches being applied for positioning and winding the printing plate 14 around a plate cylinder of a rotary press, and a plate bending section 26 that bends the printing plate 14 to wind it around the plate cylinder.

The printing plate 14 used in the first embodiment is a rectangular OPC direct printing plate comprising an aluminum plate of about 0.3 mm in depth, an anodized layer thereon, and an OPC layer with a several microns thick coating made mainly of an OPC alkali insoluble polymer.

Figure 2:
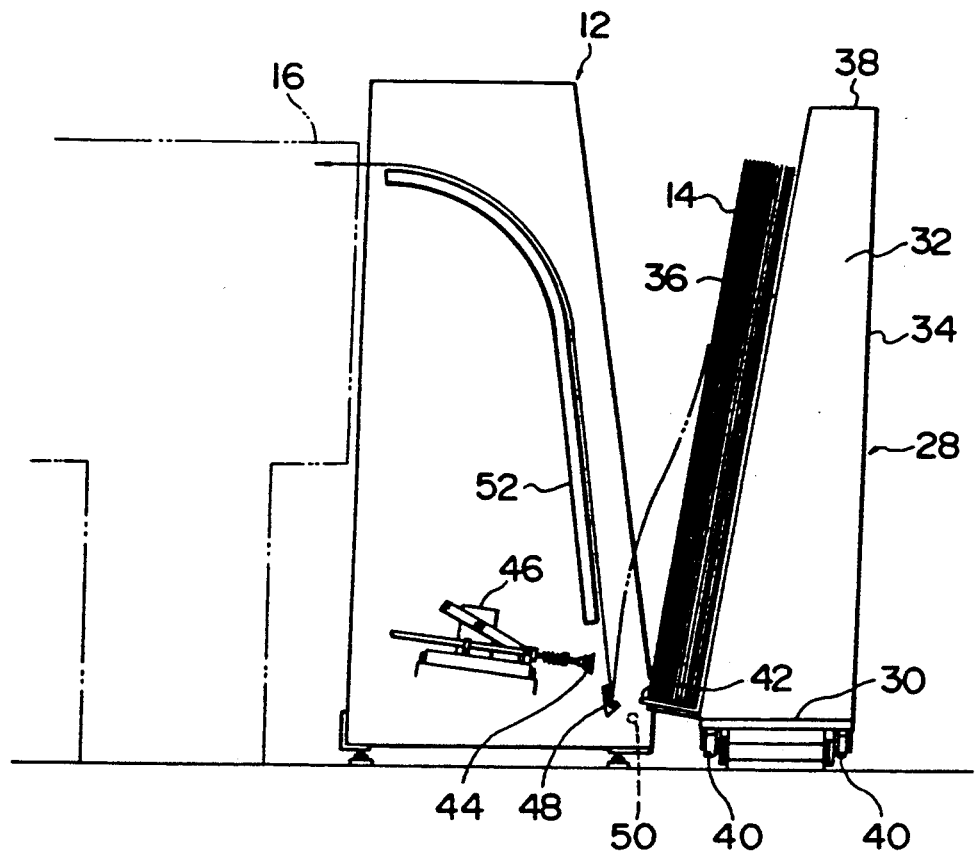
FIG. 2 is a side view indicating the schematic structure of the plate supplying section of the printing plate direct making apparatus in accordance with the first embodiment.

The plate supplying section 12, shown in FIG. 2, takes the printing plate 14 from the printing plate loading stand 28, and supplies it to the depicting section 16. The printing plate loading stand 28 will now be described. The printing plate loading stand 28 is shaped like a box wherein a pair of side walls 32, a rear wall 34, a front wall 36, and a top plate 38 are fixed on a base plate 30. In addition, the printing plate loading stand 28 is movable with wheels 40 supported by a shaft under the base plate 30. The printing plate loading stand 28 has a bracket 42 projecting from the vicinity of the lower part of the front wall 36, which is used for supporting the lower part of a plurality of printing plates 14. The front wall 36 is inclined toward the rear wall 34. Consequently, a plurality of printing plates 14 are piled up in layers and can be inclined and loaded on the bracket 42. On the other hand, the plate supplying portion 12, wherein a suction cup 44 is set in a driving mechanism 46, sucks the lower part of the printing plate 14 in the topmost layer from the printing plate loading stand 28 positioned on the opposite side, and accommodates the printing plate 14 into the V-shaped groove of a supporting angle 48. Opposite to the suction cup 44 with respect to the supporting angle 48, a separating bar 50 is provided. The separating bar 50 is moved upward and downward by an unillustrated separating bar driving device. By moving the separating bar 50 upward, the intermediate or upper part of the printing plate 14 is pulled out of the printing plate loading stand 28 and passed to a supporting stand 52 in the plate supplying section 12. Accordingly, when the supporting angle 48 is moved up, the lower part of the printing plate 14 is pushed up, and the printing plate 14 is fed into the depicting section 16 along the supporting stand 52.

Figure 3:
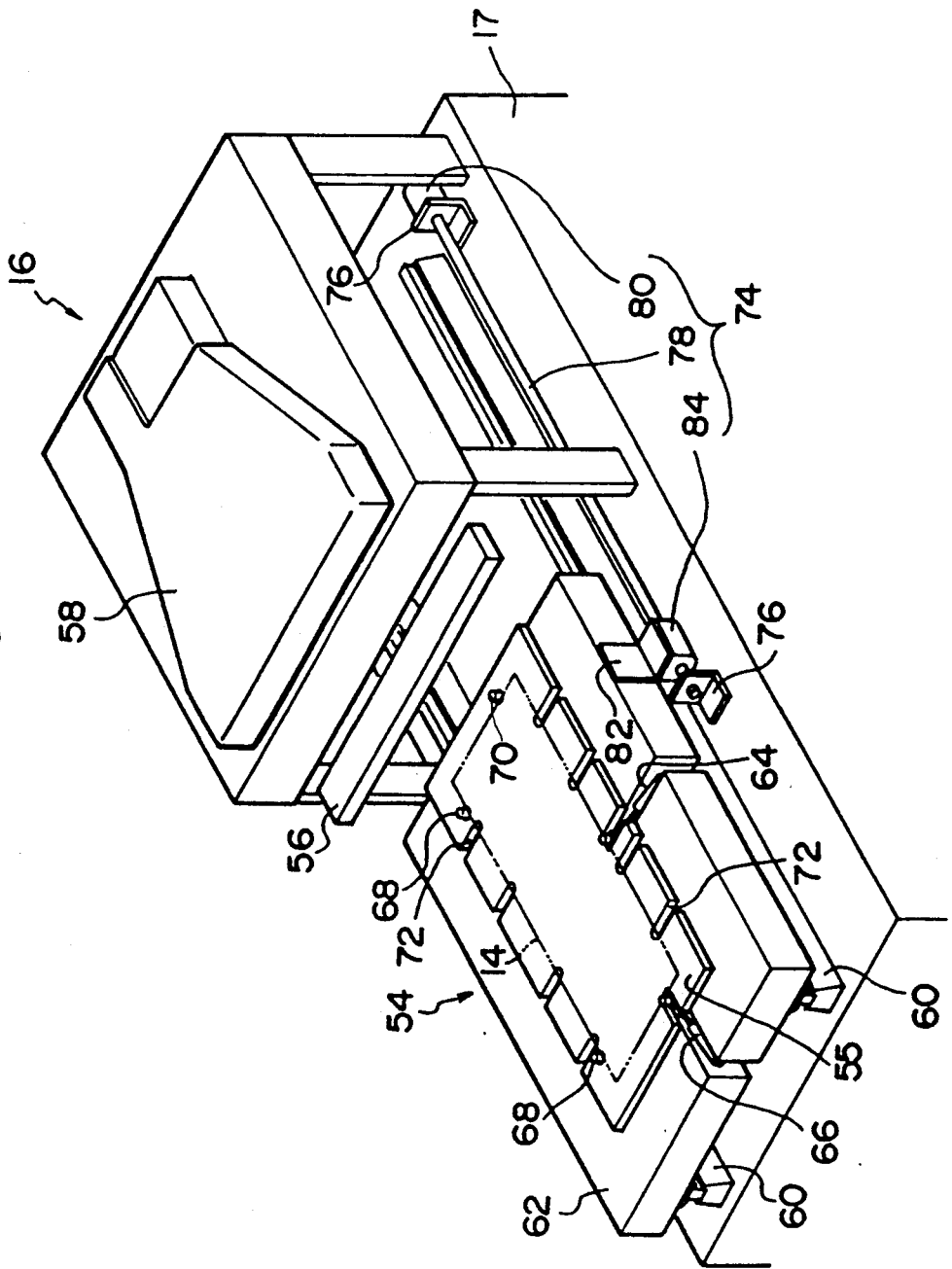
FIG. 3 is a perspective view of a depicting section of the printing plate direct making apparatus in accordance with the first embodiment.

The depicting section 16, shown in FIG. 3, is provided on a frame stand 17, and comprises a plate stand 54 on which the printing plate 14 is loaded, a charging device 56 on which electrically charges the printing plate 14, and a depicting device 58 which depicts an image on the imaging area of the printing plate 14.

The plate stand 54 comprises a surface plate 55 with a flat rectangular surface on which the printing plate 14 is loaded, and a movable frame 62 used for fixedly supporting the surface plate 55. The movable frame 62 can be moved toward the drawing device 58 along a pair of rails 60 installed on the frame stand 17.

The plate stand 54 comprises a positioning device that positions the printing plate 14, supplied from the plate supplying portion 12, on the surface plate 55, and a suction device (unillustrated) that sucks the positioned printing plate 14 onto the surface plate 55. The positioning device includes a pushing means having a first pusher 64 that pushes and moves the printing plate 14 on the surface plate 55 in a first direction (i.e., in the widthwise direction of the surface plate 55) and a second pusher 66 that pushes and moves the printing plate 14 in a second direction at a right angle to the first direction (i.e., in the lengthwise direction of the surface plate 55). The positioning device also includes a positioning means having two first reference pins 68 that are provided corresponding to the first pusher 64 to abut against the lengthwise side edge of the printing plate 14 moved by the first pusher 64 and position the first direction of the printing plate 14, and a second reference pin 70 which is provided corresponding to the second pusher 66 to abut against the widthwise side edge of the printing plate 14 moved by the second pusher 66 and position the second direction of the printing plate. At the time of positioning, first and second pushers 64, 66, first reference pin 68, and second reference pin 70 are projected above the surface of the surface plate 55. However, when the positioning process is completed, they are moved under the surface plate 55. The above-described pushing means and positioning means are structured in the same way as those contained in the punching section 24 that will be described later, and therefore, the explanation of these means is omitted here. For more details, refer to the explanation of the punching section 24. The printing plate 14 positioned on the surface plate 55 by the positioning device is sucked and fixed onto the surface plate 55 by the suction device (unillustrated). The suction device (unillustrated) is structured in the same way as one contained in the punching section 24 that will be described later, and therefore, the explanation of the suction device is omitted here. For more details, refer to the explanation of the punching section 24. Notches 72 are made at desired intervals along the longitudinal direction in both widthwise ends of the surface plate 55. These notches 72 are provided to insert a claw (unillustrated) used for catching the widthwise edges of the printing plate 14 and removing the printing plate 14 from the depicting section 16 after processing the printing plate 14 in the depicting section 16.

The depicting section 16 contains a driving device 74 which drives the plate stand 54 toward the depicting device 58. The driving device 74 comprises a feed screw 78 which is rotatably supported by means of a pair of brackets 76 on the frame stand 17, a motor 80 which rotates the feed screw 78 forward or backward, and a feed nut 84 which is fixed on the plate stand 54 by means of a mounting bracket 82 and which is connected to the feed screw 78. Accordingly, when the feed screw 78 is rotated forward by the motor 80, the plate stand 54 is moved toward the charging device 56 and the depicting device 58 along the rails 60. On the other hand, when the feed screw 78 is rotated backward by the motor 80, the plate stand 54 is moved backward along the rails 60.

The printing plate 14 is subject to positive charging electrically by the corona discharge from the charging device 56 when it is moved toward the charging device 56 and the depicting device 58. On the printing plate 14 that has been moved under the depicting device 58 and has been positive-charged, the image is subject to scanning by the 780 nm semiconductor laser beam emitted from the depicting device 58. The printing plate 14 whose surface has a depicting image is moved to its original position, that is, a position determined by the backward rotation of the feed screw 78 by the motor 80.

The developing process section 18 comprises a developing portion 86 that develops an electrostatic latent image on the printing plate 14 by applying a liquid toner as a developing solution to the printing plate 14, a squeezing portion 88 that squeezes the printing plate 14 to remove unnecessary toner, a drying portion 90 that dries the squeezed printing plate 14, and a conveying device (unillustrated) that conveys the printing plate 14 to the developing portion 86, the squeezing portion 88, and the drying portion 90. After an image is recorded on the depicting section 16, that is, after an electrostatic latent image is formed on the printing plate 14, the printing plate 14 is clipped by the above-described unillustrated clip, and then removed. After the removal of this printing plate 14, it is conveyed to the developing process section 18. In this section, while being conveyed by the conveying device (unillustrated) a liquid toner is applied to the printing plate 14, the printing plate 14 is developed, and the unnecessary toner is removed. Then, the printing plate 14 is dried. The developing process is performed by the reversal development method in the developing portion 86. The printing plate 14 that is already positive-charged by the charging device 56 is developed by using the positive-charged toner.

The fixing process section 20 comprises a fixing portion 92, which, with a fixing lamp, heats the toner grains adhering to the imaging area on the printing plate 14 and changes them into a film to fix them on the printing plate 14, a cooling portion 94 that cools the heated printing plate 14, a drying portion 96 that dries the cooled printing plate 14, and a conveying device (unillustrated) that conveys the printing plate 14 to the fixing portion 92, the cooling portion 94, and the drying portion 96. After being subject to the developing process in the developing process section 18, the printing plate 14 is conveyed to the fixing process section 20. At this time, while the printing plate 14 is being conveyed by the conveying device (unillustrated), the toner grains are fixed on the printing plate 14, and the printing plate 14 is cooled and dried.

The etching section 22 comprises an etching portion 98 that applies an alkali solution to the printing plate 14 and etches the OPC layer on the non-imaging area excluding the imaging area where the toner image has been formed, on the printing plate 14, a squeezing portion 100 that squeezes the printing plate 14 to remove the alkali solution, a rinsing portion 102 that rinses the squeezed printing plate 14 to remove the etched OPC layer and alkali solution, a gumming solution coating portion 104 that coats the rinsed printing plate 14 with a gumming solution to protect the imaging surface of the printing plate 14, and the conveying device (unillustrated) that conveys the printing plate 14 to the etching portion 98, the squeezing portion 100, the rinsing portion 102, and the gumming solution coating portion 104. Accordingly, the printing plate 14 that has been subject to the fixing process in the fixing process section 20 is etched while being conveyed through the etching section 22 by the conveying device (unillustrated), and the OPC layer is removed from the non-imaging area. Then, the plate surface is protected by the gum coating.

After processing in the etching section 22, the printing plate 14 is conveyed to the waiting portion 106 provided between the etching section 22 and the punching section 24 which follows. The printing plate 14 is made ready for punching.

The punching section 24 comprises a surface plate 110 on which the printing plate 14 is loaded, a positioning device that positions the printing plate 14 loaded on the surface plate 110, a suction device 300 that sucks and fixes the positioned printing plate 14 on the surface plate 110, a punching device 400 that punches positioning notches and round holes, which are required for positioning and winding the printing plate 14 around a rotary press (not shown), on the printing plate 14 sucked onto the surface plate 110, and another punching device 450 that punches other positioning notches for positioning and winding the printing plate 14 around the rotary press.

Figure 4:
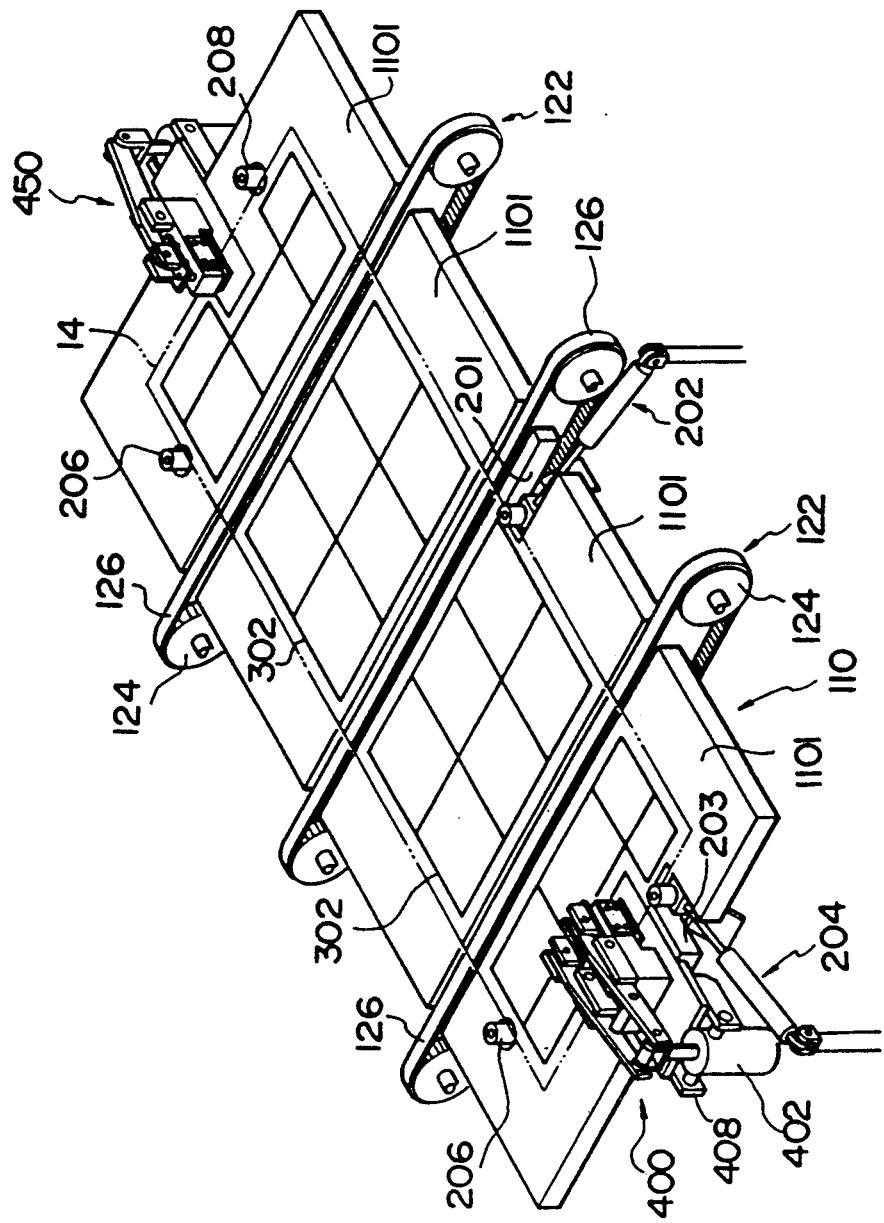
FIG. 4 is a perspective view of a punching section of the printing plate direct making apparatus in accordance with the first embodiment.
Figure 5:
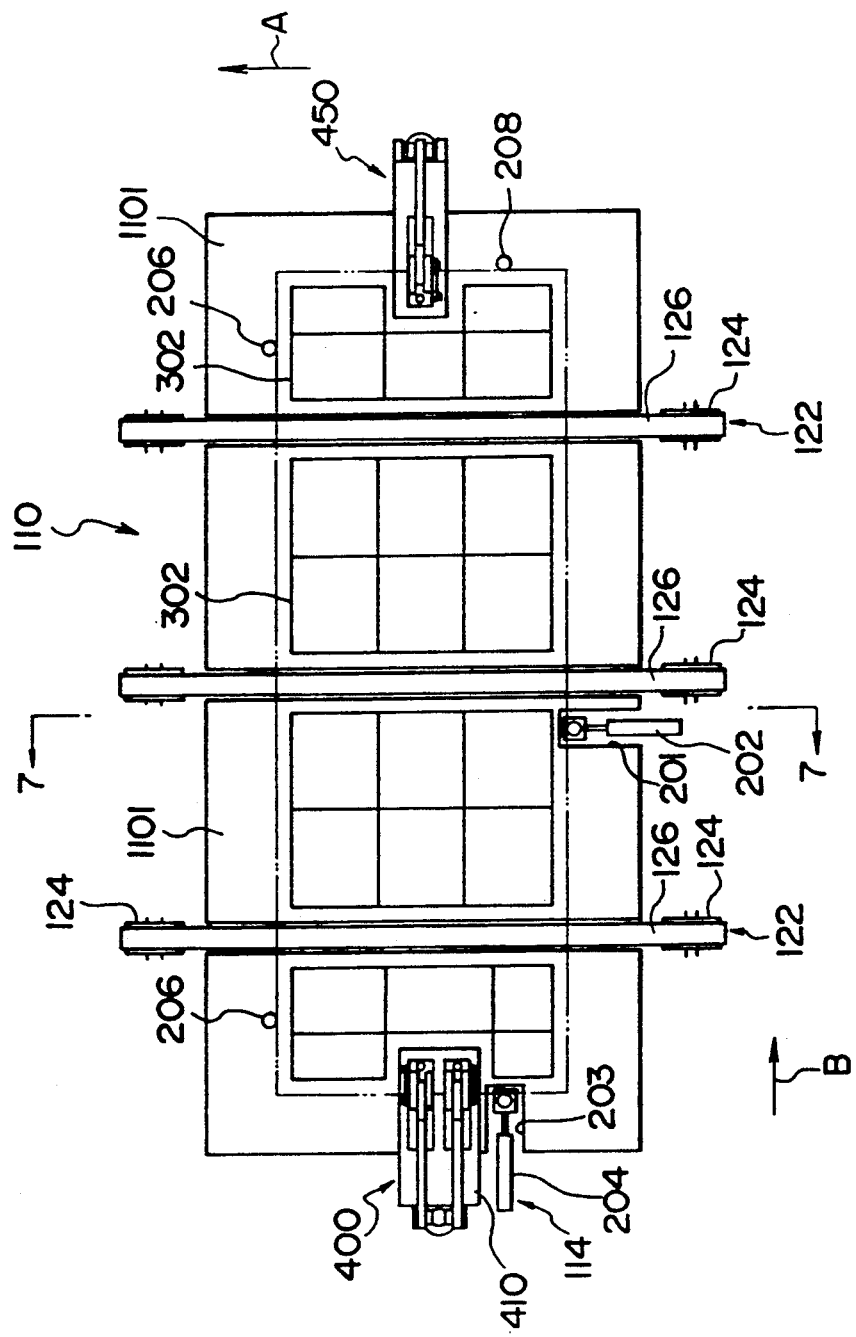
FIG. 5 is a plan view of the punching section.
Figure 6:
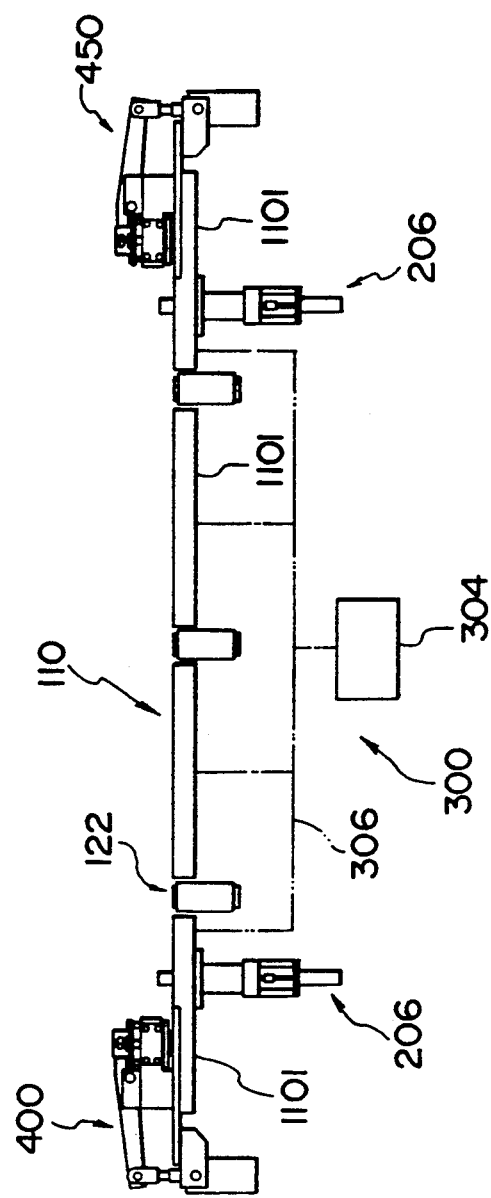
FIG. 6 is a front view of the punching section.

The surface plate 110, as illustrated in FIGS. 4 to 6, forms a rectangle consisting of four divisions 1101. Conveying devices 122 for conveying the printing plate 14 along the width of the surface plate 110 are installed between adjacent divisions 1101. Each conveying device 122 comprises a pair of pulleys 124 that are driven and rotated by an unillustrated motor installed on the outer side of the width of the surface plate 110, and a conveying belt 126 that is wound around the above-described pulleys 124 and driven by the rotation of the pulleys 124. In the vicinity of the surface plate 110, an unillustrated raising and lowering device is installed to move the conveying device 122 up and down. Accordingly, when the printing plate 14 is conveyed, the conveying device 122 is moved up by the raising and lowering device such that the upper portion of the conveying belt 126 can be positioned slightly upward of the surface of the surface plate 110. The unillustrated motor is driven at this elevated position, the pulleys 124 are rotated, the conveying belt 126 is moved, and the printing plate 14 is conveyed in the direction indicated by arrow A in FIG. 5. When the printing plate 14 is not conveyed, for example, when the printing plate 14 is positioned or when the printing plate 14 is sucked onto the surface plate 110, the conveying device 122 is moved down by the raising and lowering device such that the upper portion of the conveying belt 126 can be positioned downward of the surface of the surface plate 110. Further, the conveying device 122 and the raising and lowering device are connected to an unillustrated controlling device and are controlled by this controlling device.

The positioning device comprises the pushing means containing a third pusher 202 that pushes and moves the printing plate 14 loaded on the surface plate 110 in the widthwise direction of the surface plate 110, (i.e., in a third direction indicated by arrow A in FIG. 5) and a fourth pusher 204 that pushes and moves the above-described printing plate 14 in the lengthwise direction of the surface plate 110 (i.e., in a fourth direction at a right-angle to the third direction, indicated by arrow B in FIG. 5). The positioning device also comprises positioning means containing two third reference pins 206, provided corresponding to the third pusher 202, that are used for positioning the third direction of the printing plate 14 by abutting against side edges the end of the printing plate 14 moved by the force of the third pusher 202, and a fourth reference pin 208 provided corresponding to the fourth pusher 204, that is used for positioning the fourth direction by abutting against a side edge of the printing plate 14 moved by the force of the fourth pusher 204. The third pusher 202 is fixed in a recessed and notched portion 201 in an end of the length of the surface plate 110. Further, the third direction indicates the right to left direction of the printing plate 14, while the fourth direction indicates the top to bottom direction of the printing plate 14.

First of all, the pushing means is described below.

The third pusher 202 is structured in the same way as the fourth pusher 204, so only the explanation for the third pusher 202 is provided. The explanation for the fourth pusher 204 is omitted here.

Figure 7:
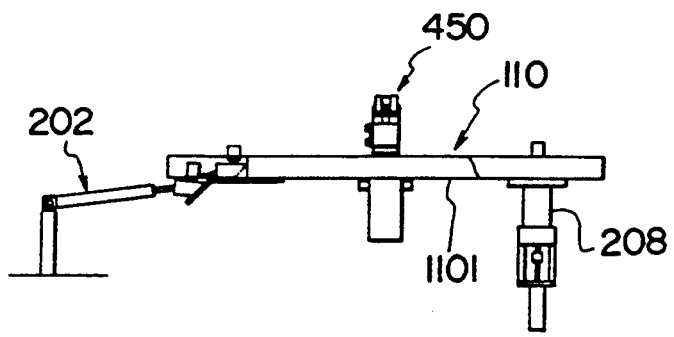
FIG. 7 is a sectional view of FIG. 5 taken along the line 7—7, with the conveying device omitted.
Figure 8:
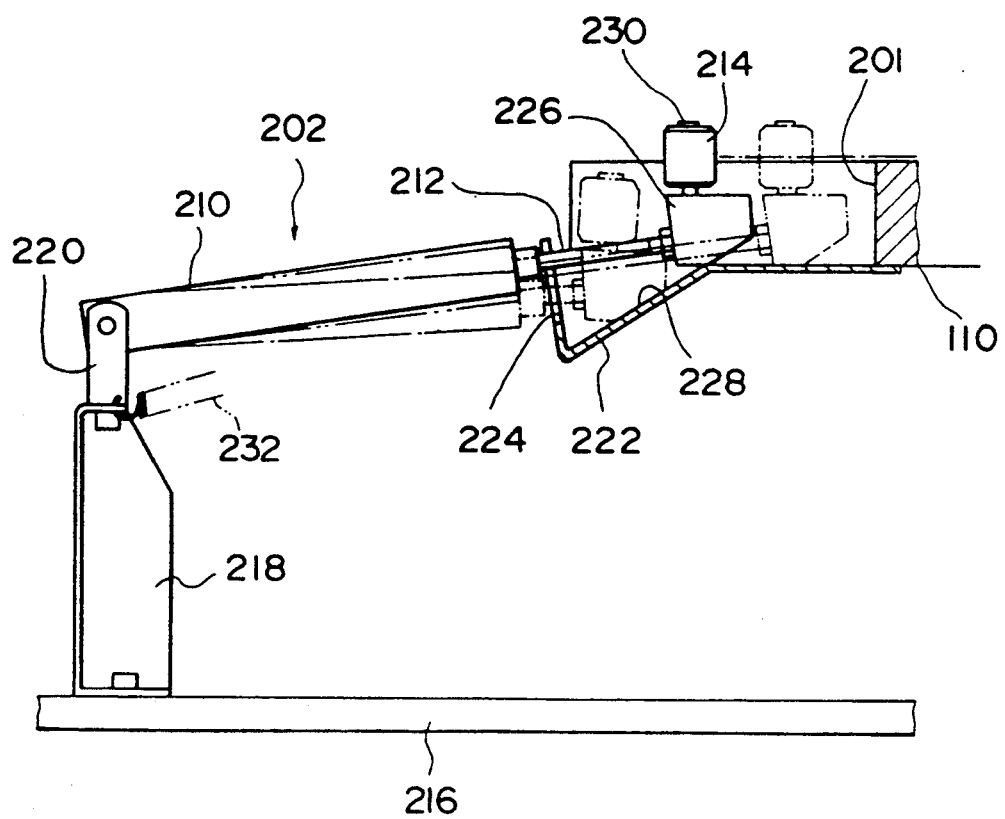
FIG. 8 is a side view of a pushing means of the printing plate direct making apparatus in accordance with the first embodiment.

As shown in FIGS. 7 and 8, the third pusher 202 comprises an air cylinder 210 and a rotor 214 supported to a driving shaft 212 of the air cylinder 210. The air cylinder 210 is rotatably supported by a bracket 220 fixed to the top end of a supporting bracket 218 standing up from a base 216. The driving shaft 212 of the air cylinder 210 is inserted into a long through hole 224 of a guide plate 222 mounted on the back surface of the surface plate 110. A guide piece 226 is secured to the distal end of the driving shaft 212. The guide piece 226, having an inclined surface on its downward side, is disposed at an inclined surface 228 of the guide plate 222, and can be slid on this inclined surface 228. An end of the pin 230 which rotatably supports the rotor 214, is fixed on the upward side of the guide piece 226. The rotor 214 is rotatable with the pin 230 as its center.

A pair of tension coil springs 232 (only one is shown in FIG. 8) are set along both sides of the air cylinder 210. One end of the springs 232 is fixed to the guide piece 226 and the other end thereof is fixed to the supporting bracket 218. The air cylinder 210 is biased downward by the tension coil springs 232. When the air cylinder 210 is not being operated, the rotor 214 is retracted to a position lower than the surface plate 110, as indicated by the alternate long-and-short dash line in FIG. 8. After the air cylinder 210 is operated and the driving shaft 212 is projected from the body of the air cylinder 210, the guide piece 226 is elevated at a slant on the slope 228, and the rotor 214 is projected partially upward from the surface plate 110 and moved to the position indicated by the two-dot chain line in FIG. 8. This movement of the rotor 214 causes a side edge of the printing plate 14 loaded on the surface plate 110 to be pushed so that the printing plate 14 is moved. It is to be noted that the fourth pusher 204 may be moved in the direction opposite to direction indicated by arrow B in FIG. 5 to such an extent that the fourth pusher 204 does not obstruct the movement of the printing plate 14 by the conveying devices 122. Therefore, the rotor 214 does not need to be retracted to a position lower than the surface plate 110. In addition, the air cylinder 210 is employed as a driving source for the pushing means so that the desired pushing force can be easily obtained since the pushing force is determined by only the sectional area of the air cylinder 210 and the supplied air pressure.

Figure 9:
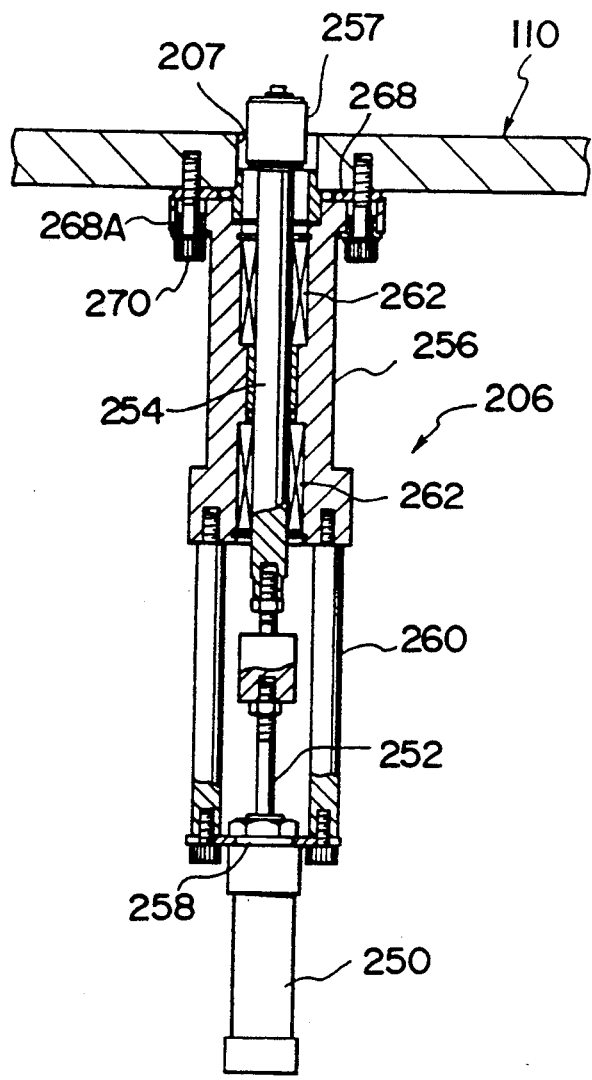
FIG. 9 is a sectional view of a positioning reference pin.
Figure 10:
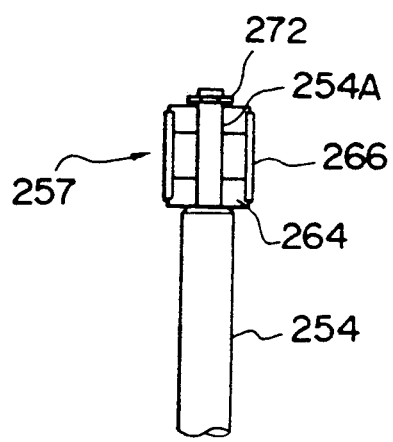
FIG. 10 is an expanded sectional view of an abutting portion the reference pin.

Next, the positioning means will be described with reference to FIGS. 9 and 10.

The third reference pin 206 comprises an air cylinder 250, a driving shaft 252, a shaft member 254 coaxially linked with the driving shaft 252, a cylindrical bearing 256 accommodating the shaft member 254 movably in the axial direction, and an abutting portion 257 for abutting against a side edge of the printing plate 14, which is supported at the top of the shaft member 254.

The air cylinder 250 is fixed to the end portion of the bearing 256 at a given interval by rods 260 through a mounting bracket 258 which is mounted on the air cylinder 250. The bearing 256 has two linear ball bearings 262 along its axis on the internal circumferential wall, and the shaft member 254 is guided smoothly along its axis. The abutting portion 257 is supported by a small-diameter portion 254A, formed at the top of the shaft member 254. In addition, the abutting portion 257 comprises a pair of rolling bearings 264 which are rotatably supported to the small-diameter portion 254A apart from each other by a given distance, and a cylindrical abutment member 266 fitted in the external circumferences of these rolling bearings 264. Therefore, the abutment member 266 is rotatable smoothly by the rolling bearings 264, with the small-diameter portion 254A as the center. The abutment member 266 is comprised of the internal wheel of a needle bearing, and its outer peripheral surface forms a true circle with a high accuracy. In addition, a snap ring 272, such as an E-ring, for preventing the abutting portion 257 from coming off, is attached at the top of the small-diameter portion 254A of the shaft member 254. The third reference pin 206 is connected to an unillustrated controlling device which controls the operation of the air cylinder 250.

As mentioned above, the third reference pin 206 is fixed to the back surface of the surface plate 110 in the vicinity of a round through hole 207, which has been made on the surface plate 110, with screws through the insulation members 268 and 268A. Therefore, when the printing plate 14 is positioned, the air cylinder 250 is operated and the driving shaft 252 is moved in its projecting direction. As a result, the shaft member 254 is moved through the round through hole 207 in a projecting direction, while being guided by the bearing 256, up to a position where the abutting portion 257 is illustrated in FIG. 9, that is, a position in which the upper half of the abutment member 266 is projected above the surface of the surface plate 110. In this state, a side edge of the printing plate 14 can be abutted against the abutting portion 257 of the third reference pin 206, when it is pushed. In addition, when the printing plate 14 has been completely sucked and fixed on the surface plate 110, as will be described later, the air cylinder 250 is operated backward and the driving shaft 252 is moved in the direction of accommodation. As a result, the abutting portion 257 is moved below the surface of the surface plate 110. In reference to mounting the third reference pin 206 on the surface plate 110 through the insulation members 268 and 268A, the third reference pin 206 is constituted such that high conductivity can be obtained when the printing plate 14 abuts against the abutment member 266. For example, conductive grease is filled between the abutment member 266 of the abutted portion 257 and the shaft member 254 for high conductivity. Therefore, a signal is transmitted to a controlling device (not shown) through the third reference pin 206 such that when the printing plate 14 abuts against the abutment member 266, the printing plate 14 is fixed tightly to the surface plate 110 by a negative pressure supplying device 304 (described later) controlled by the controlling device, the pushing force to the printing plate 14 by the third pusher 202 controlled thereby is stopped, and the driving shaft 212 of the air cylinder 210 in the third pusher 202 is moved in the direction opposite to the direction which the printing plate 14 is pushed to be retracted to its original position. Further, the fourth reference pin 208 may be structured the same as said third reference pin 206, but can be fixed on the surface plate 110 unlike said third reference pin 206 since it does not obstruct the conveying of the printing plate 14 by the conveying devices 122. That is to say, the fourth reference pin 208 needs not to be constructed such that the abutting portion 257 is moved up and down.

The suction device 300, as shown in FIGS. 5 and 6, comprises suction grooves 302 for each division 1101 in the surface plate 110, the negative pressure supplying device 304 for supplying negative pressure to these suction grooves 302, and a negative pressure supplying line 306 for connecting the negative pressure supplying device 304 to each of the suction grooves 302. Accordingly, the printing plate 14 positioned by the above-described positioning device is sucked and fixed to the surface plate 110 since the negative pressure supplying device 304 supplies negative pressure to the suction grooves 302.

Figure 11:
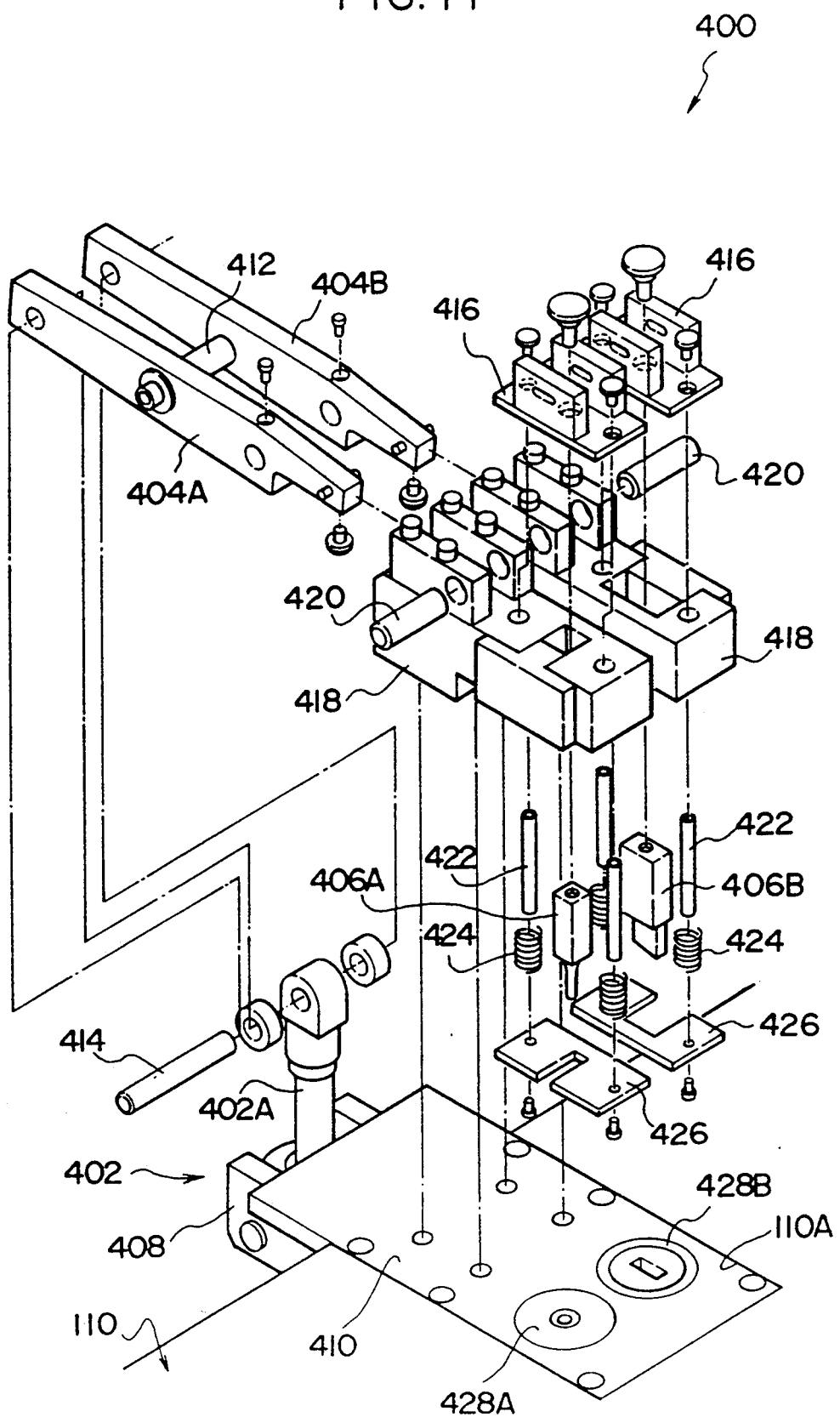
FIG. 11 is a divided perspective view of a punching device.

The punching device 400, as shown in FIGS. 4 and 5, is installed at one lengthwise end and the widthwise center of the surface plate 110. Referring now to FIG. 11, the punching device 400 will be described in detail.

The punching device 400 comprises an air cylinder 402, a pair of arms 404A and 404B linked with a driving shaft 402A of the air cylinder 402, and a pair of punches 406A and 406B each linked with the arms 404A and 404B.

The body of the air cylinder 402 is supported by a rectangular and flat base 410 via a mounting bracket 408. The base 410 is fixed to the surface plate 110 in the recessed portion 110A which has been formed in the end portion of the surface plate 110 such that the surface of the base 410 is flush with the surface of the surface plate 110. The arms 404A and 404B have the same shape and are linked with each other at a desired interval in their centers in their lengthwise direction by the shaft member 412. The arms 404A and 404B each are linked at their one ends with an end of the driving shaft 402A by a shaft member 414, while the punches 406A and 406B each are linked with the other ends of the arms 404A and 404B by supporting members 416. The punch 406A is a tool for punching a positioning round hole on the printing plate 14, and its end has a columnar portion. The punch 406B is a tool for punching a positioning square hole on the printing plate 14, and its end has a prismatic portion. The arms 404A and 404B are rotatably supported between the portion linked with said shaft member 412 and the other ends of the arms 404A and 404B by shaft members 420 in punch holders 418 which are fixed to the base 410. The arms 404A and 404B can be rotated with these shaft members 420 as the supporting points. Each supporting member 416 support a stopper 426 via suspension bolts 422 and springs 424. Dies 428A and 428B corresponding respectively to the punches 406A and 406B, are mounted in the base 410. In addition, an unillustrated controlling device is connected to the air cylinder 402, which is controlled by this controlling device.

In the punching device 400 as structured above, after the printing plate 14 is sucked and fixed onto the surface plate 110, the arms 404A and 404B are rotated in the punching direction through the shaft members 420 serving as the supporting points when the air cylinder 402 is operated to project the driving shaft 402A, so that the positioning round hole and the rectangular notch are punched. At this time, the portions around the areas where the round hole and the rectangular notch will be punched on the printing plate 14 are pressed by the stoppers 426 biased by the spring 424 before the round hole and rectangular notch are punched. Then, the air cylinder 402 is operated to move the driving shaft 402A in the opposite direction, and the punches 406A and 406B are separated from the printing plate 14 by the arms 404A and 404B.

The punching device 450 includes substantially the same structure as the structure for punching the rectangular notch in the punching device 400. That is to say, the punching device 450 does not include the structure for punching a round hole. For example, the punching device 450 can be constituted by substantially the same members as the air cylinder 402, the arm 404B, and the punch 406B and so on in the punching device 400. Therefore, the detailed description of the punching device 450 is omitted here. The punching device 450 punches a rectangular notch on the other longitudinal end of the printing plate 14, i.e., on the end of the printing plate 14 positioned on the opposite side of the punching device 400.

Figure 12:
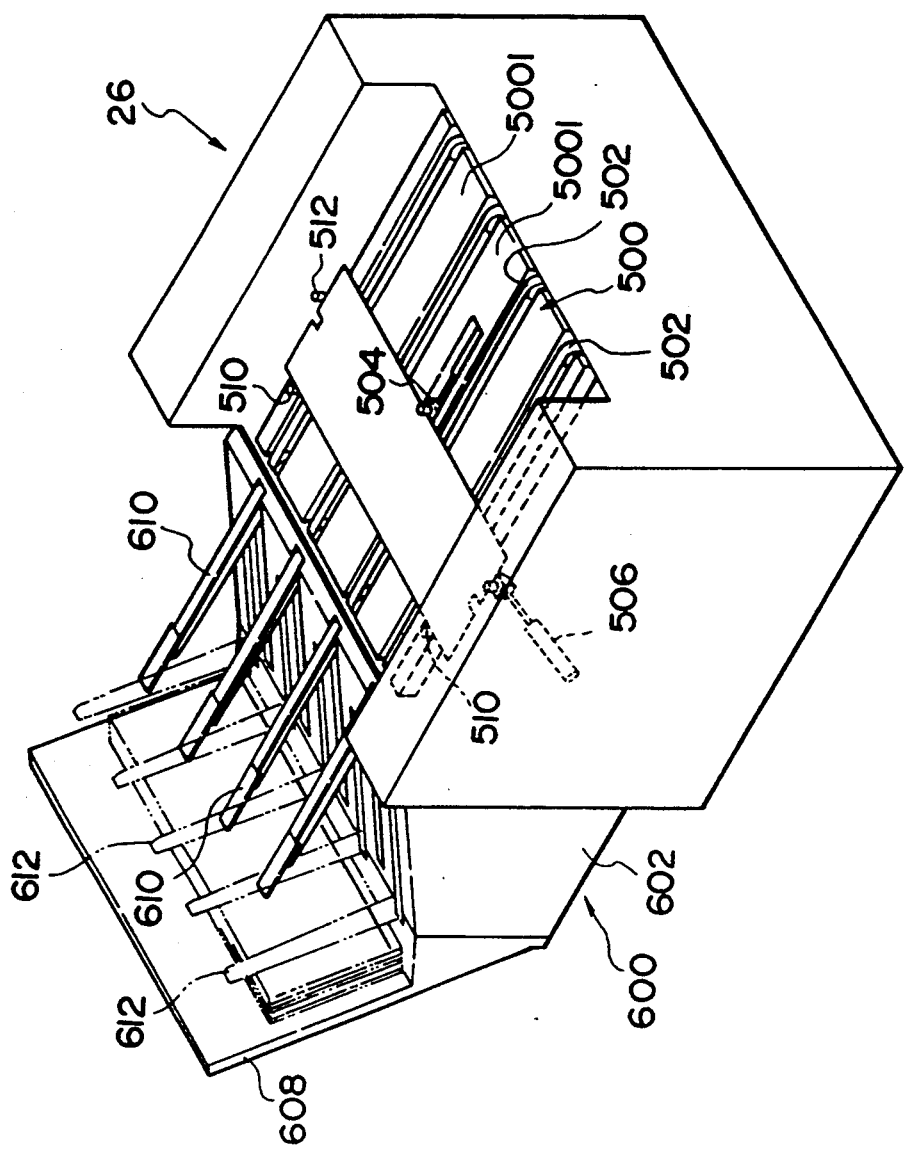
FIG. 12 is a perspective view of a plate bending section.

The plate bending section 26, as shown in FIG. 12, comprises a surface plate 500, conveying devices 502 for conveying the printing plate 14, a positioning device for positioning the printing plate 14 on the surface plate 500, a suction device (unillustrated) for sucking and fixing the positioned printing plate 14 to the surface plate 500, and a plate bending device 530 (illustrated in FIG. 13) for bending the sucked and fixed printing plate 14 into a desired shape.

The surface plate 500 is comprised of a plurality of divisions 501, and is structured in the same way as the above-described surface plate 110, while the conveying devices 502 are structured in the same way as the above described conveying devices 122. Thus, the explanation of the surface plate 500 and the conveying devices 502 is omitted here. In addition, the suction device (unillustrated) is also structured in the same way as the suction device 300 in the punching section 24, so the explanation of the suction device 300 is also omitted. The positioning device comprises a pushing means and a positioning means. The pushing means comprises a fifth pusher 504 that pushes and moves the printing plate 14 in the widthwise direction of the printing plate 14, and a sixth pusher 506 that pushes and moves the printing plate 14 in the longitudinal direction of the printing plate 14. The fifth pusher 504 and the sixth pusher 506 have the same construction, and they are constituted in the same as the above-described third pusher 202. Thus, the explanation for the fifth and sixth pushers 504 and 506 is omitted here. Further, the positioning means comprises two fifth reference pins 510 that are set corresponding to the fifth pusher 504 to abut against side edges of the printing plate 14 moved by the fifth pusher 504 for positioning the printing plate 14 in the widthwise direction thereof on the surface plate 500, and a sixth reference pin 512 that is set corresponding to the sixth pusher 506 to abut against a side edge of the printing plate 14 moved by the sixth pusher 506 for positioning the printing plate 14 in the longitudinal direction thereof on the surface plate 500. The fifth reference pins 510 are structured in the same way as the sixth reference pin 512 and the previously described third reference pins 206 as well. Thus, the explanation of the fifth and sixth reference pins 510, 512 is omitted here.

The relative positional relation between the fifth reference pins 510 and the sixth reference pin 512 in the plate bending section 26, the relative positional relation between the third reference pins 206 and the fourth reference pin 208 in the punching section 24, and the relative positional relation between the first reference pins 68 and the second reference pin 70 in the depicting section 16 are defined identically.

Figure 13:
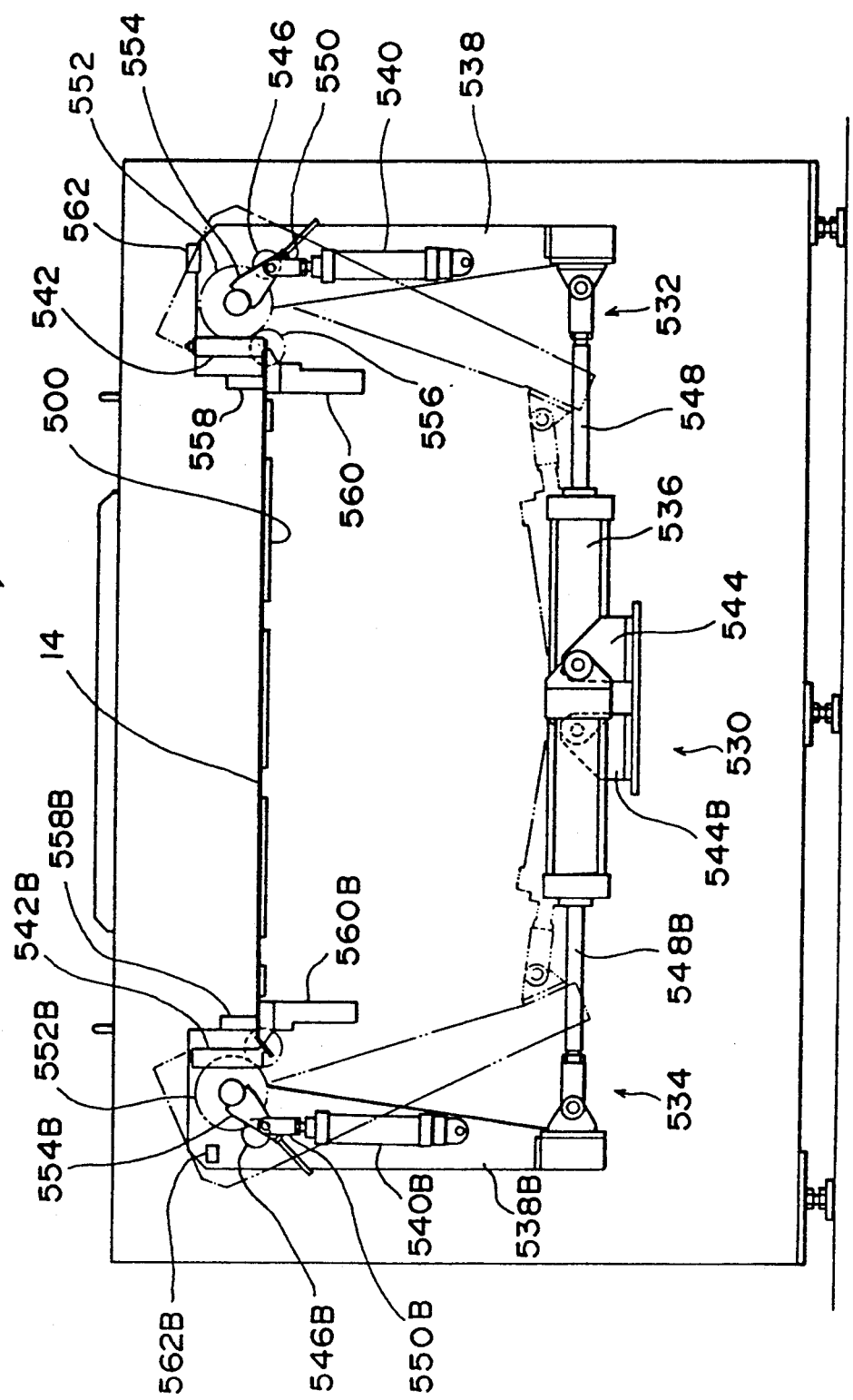
FIG. 13 is an schematic illustration of a bending device.

Referring now to FIG. 13, the plate bending device 530 will be described.

The plate bending device 530 comprises a first mechanism 532 and a second mechanism 534, corresponding to both lengthwise edge portions of the printing plate 14. The first mechanism 532 is used for bending an edge portion of the printing plate 14 in the longitudinal direction (i.e., the right-hand end of the printing plate 14 in FIG. 13), while the second mechanism 534 is used for bending the other edge portion of the printing plate 14 in the longitudinal direction (i.e., the left-hand end of the printing plate 14 in FIG. 13).

Figure 14:
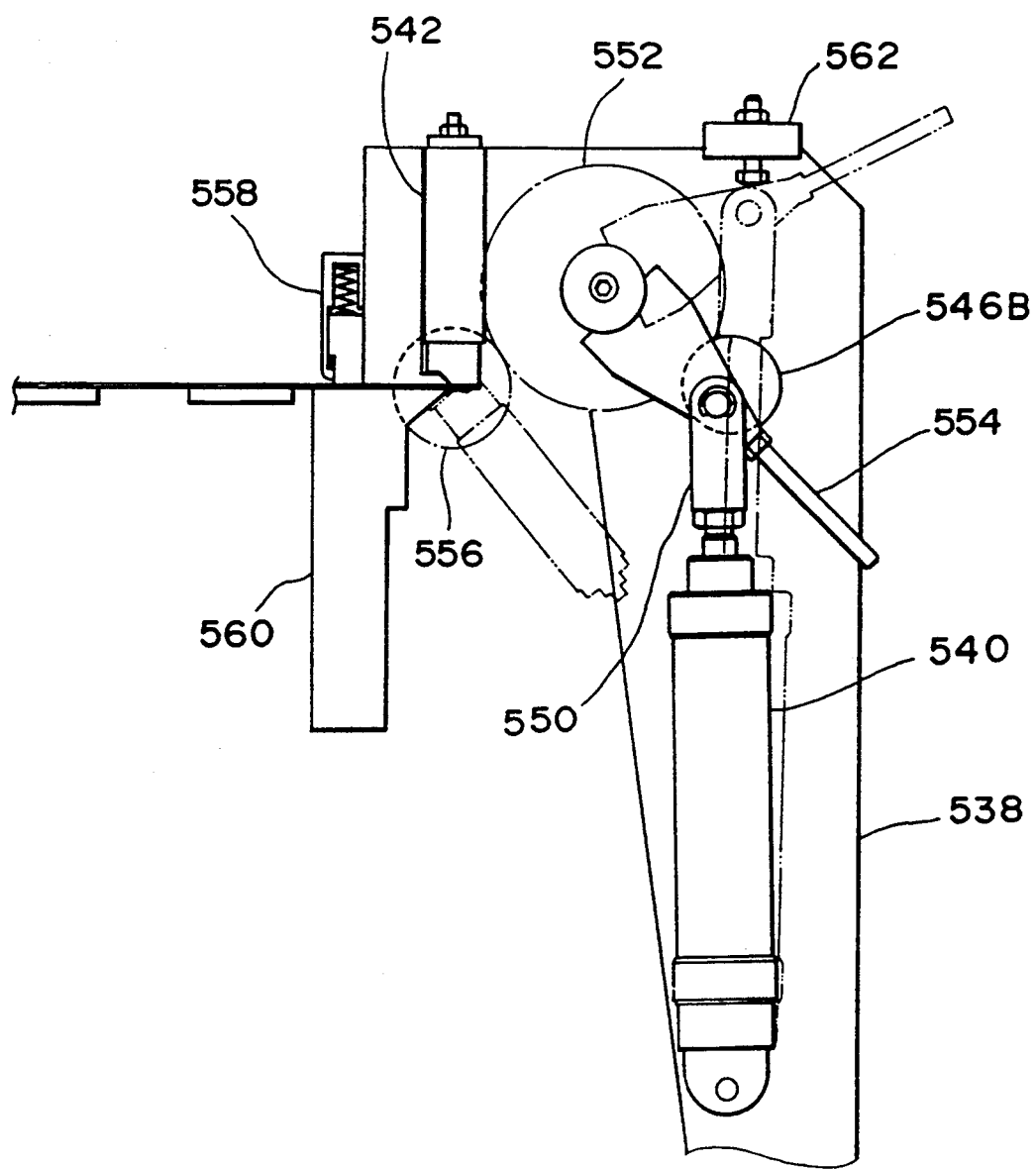
FIG. 14 is a segmentary view of the operation of the bending device.

The first mechanism 532 comprises a first air cylinder 536, an arm member 538 driven by the air cylinder 536, a second air cylinder 540 supported by the arm member 538, and a bending member 542 driven by the second air cylinder 540. The base of the first air cylinder 536 is supported by a supporting bracket 544 disposed under the surface plate 500. The arm member 538 is shaped into a substantial 'L' shape and is supported by the shaft member 546 such that the long side runs along the side of the surface plate 500 and the short side is in the vicinity of an upper surface end of the surface plate 500. The end of a driving shaft 548 of the first air cylinder 536 and the lower end of the arm member 538 are connected with each other through a shaft. Therefore, when the first air cylinder 536 is operated and the driving shaft 548 is projected, the arm member 538 is rotated counterclockwise in FIG. 13. The second air cylinder 540 is rotatably supported through its base portion on the long side of the arm member 538 such that a driving shaft 550 is positioned at the above side of the base portion. The tip end of the driving shaft 550 is linked with a crankshaft 554 fixed to a large gear 552 which is rotatably supported at the upper part of the arm member 538. The large gear 552 is engaged with a small gear 556 which is rotatably supported at the lower part in the vicinity of the tip end of the short side of the arm member 538. To this small gear 556, the plate bending member 542 is fixed. Therefore, when the second air cylinder 540 is operated and the driving shaft 550 is projected, the large gear 552 is rotated counterclockwise in FIG. 13 via the crankshaft 554, while the small gear 556 and the plate bending member 542 are rotated clockwise in FIG. 13. At the forward side edge of the short side of the arm member 538, a pressing member 558 for pressing the printing plate 14 to the surface plate 500 with biasing force is provided. In the vicinity of the edge portion of the surface plate 500, a die 560 is provided corresponding to the pressing member 558 and the plate bending member 542. In addition, as shown in FIG. 14, a stopper 562 which abuts against the crankshaft 554 for limiting the rotation, is provided above the crankshaft 554 on the arm member 538. The first air cylinder 536 and the second air cylinder 540 are connected to an unillustrated controller respectively, and the operation of these air cylinders 536, 540 is controlled by this controller.

The first mechanism 532 is located symmetrical with the second mechanism 534 and structured in almost the same way as the second mechanism 534. Thus, the members and mechanisms of the second mechanism 534 corresponding to the first mechanism 532 are given the same reference members followed by 'B'. Therefore, only mechanisms different from the first mechanism 532 are described, but the explanation of the other mechanisms is omitted.

The first mechanism 532 is different from the second mechanism 534 in so far as the edge portion of the printing plate 14 obtained after bending has a different shape. Therefore, the bending member 542 is different from the bending member 542B in so far as the positions of the stoppers 562 and 562B for limiting the rotations of the crankshafts 554 and 554B and the shapes of the bending surfaces of the bending members 542 and 542B.

Figure 15:
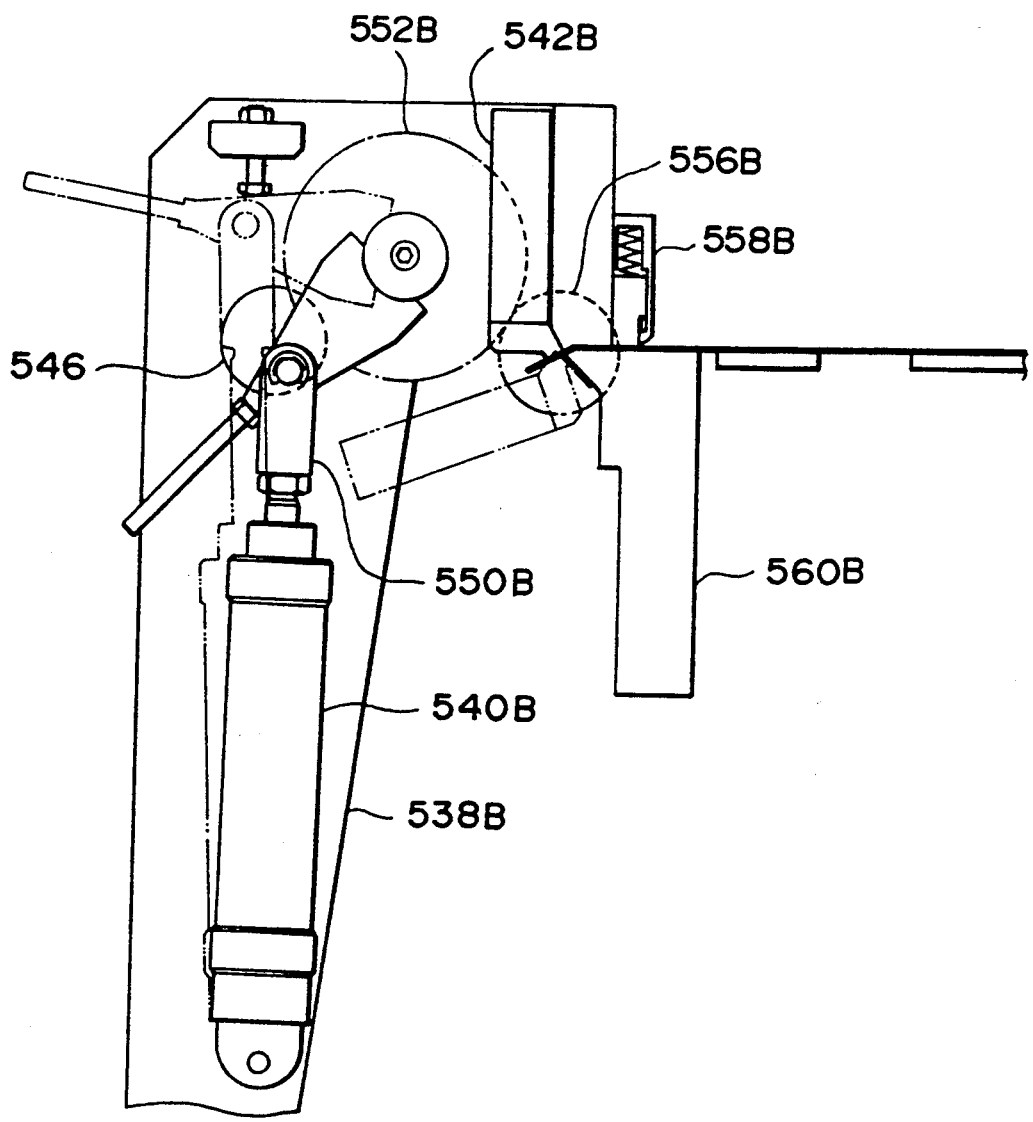
FIG. 15 is another segmentary view of the operation of the bending device.
Figure 16:
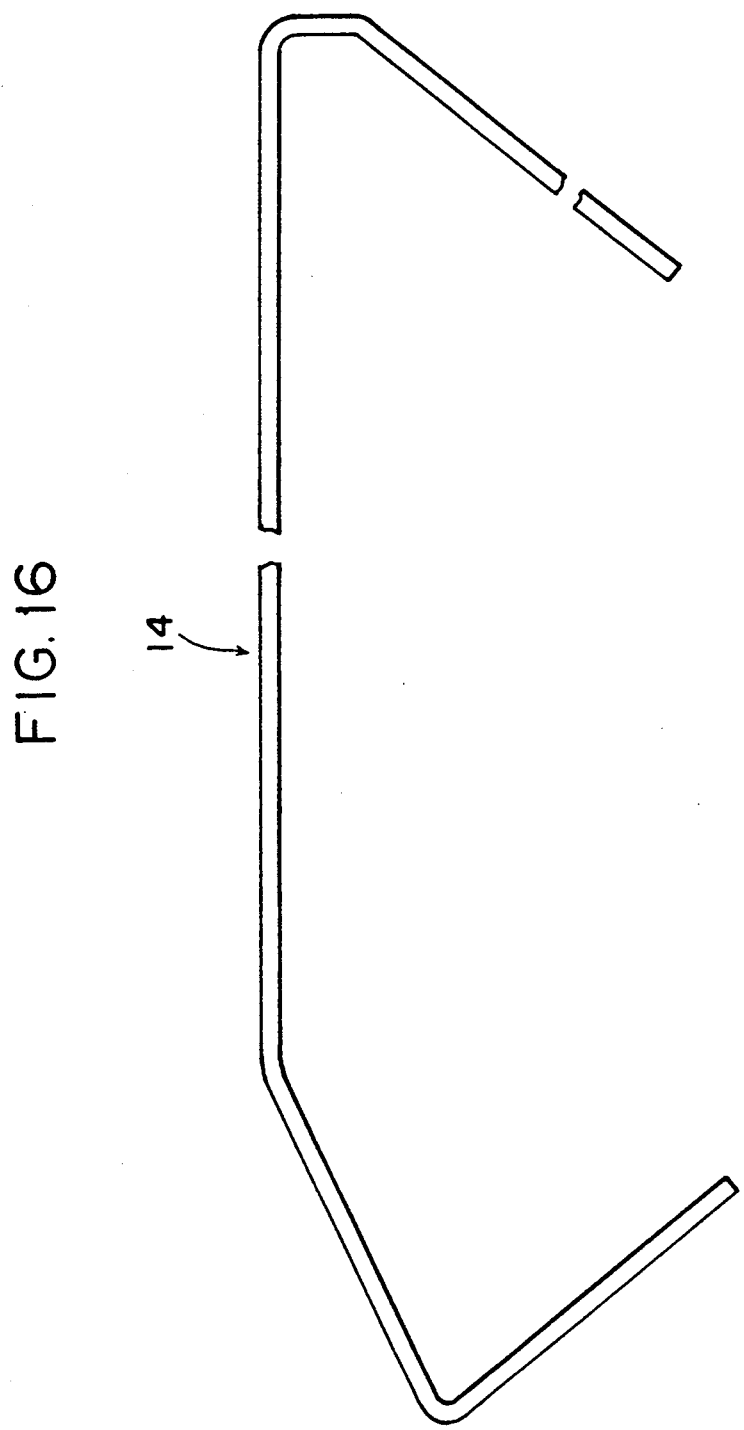
FIG. 16 is an enlarged view of the primary portions of a printing plate bent by the bending device.

Referring now to FIGS. 13, 14, and 15, the operation of the plate bending device 530 will be described. When the plate bending device 530 starts to bend the printing plate 14, the printing plate 14 is positioned by the positioning device and sucked onto the surface plate 500 by the unillustrated suction device. In this state, first of all, the first air cylinders 536 and 536B are operated, and the driving shafts 548 and 548B are projected. As a result, the arm member 538 is rotated counterclockwise, with the shaft member 546 as its center in FIG. 13, and becomes the state indicated by a solid line in FIG. 14. During the process up to this state, the vicinity of an edge portion of the printing plate 14 (i.e., the right-hand end in FIG. 13) is pushed onto the die 560 via the pressing member 558. At the same time, the arm member 538B is rotated clockwise, with the shaft member 546B as its center in FIG. 13, and becomes the state indicated by a solid line in FIG. 15. During the process up to this state, the vicinity of the other edge portion of the printing plate 14 (i.e., the left-hand end in FIG. 13) is pressed onto the die 560B via the pressing member 558B, and the other edge portion of the printing plate 14 is bent downward by the bending member 542B. Then, the second air cylinders 540 and 540B are operated, and the driving shafts 550 and 550B are projected. Then, the crankshaft 554 is pushed and continues to be rotated until it abuts against the stopper 562. As a result, the bending member 542 is rotated clockwise by the large gear 552 and the small gear 556 in FIG. 14, and becomes the state indicated by the two-dot chain line. At the same time, the crankshaft 554B is pushed and continues to be rotated until it abuts against the stopper 562B. As a result, the bending member 542B is rotated counterclockwise by the large gear 552B and small gear 556B in FIG. 15, and becomes the state indicated by the two-dot chain line. The states of both edge portions of the printing plate 14 bent in this manner are shown in FIG. 16. In FIG. 16, the edge portion on the right side has been bent by the first mechanism 532, while the edge portion on the left side has been bent by the second mechanism 534.

Figure 17:
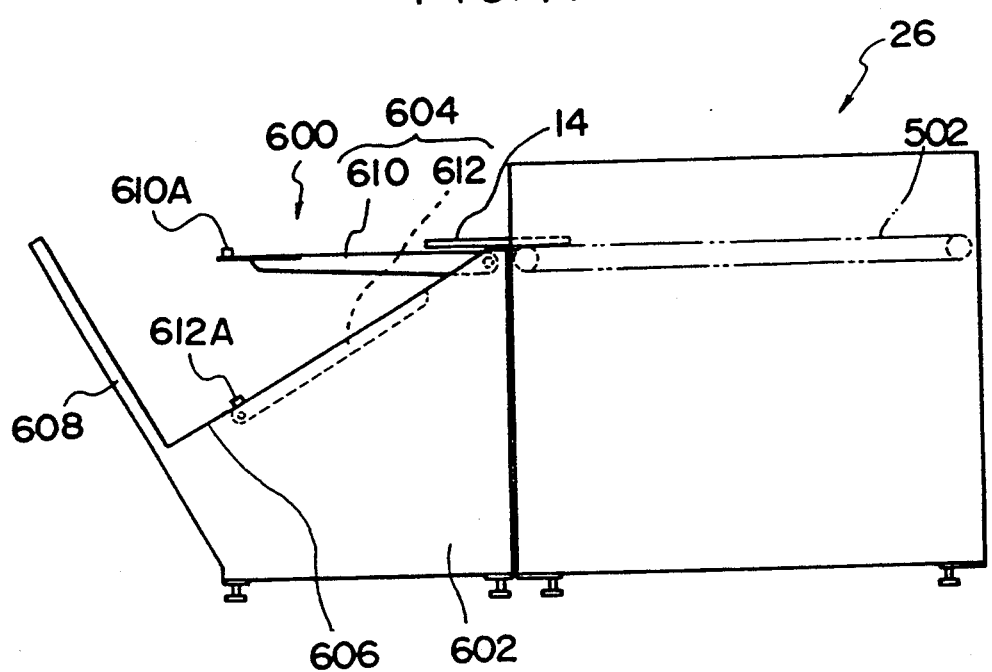
FIG. 17 is a side view illustrating the operation of an accommodating portion.
Figure 18:
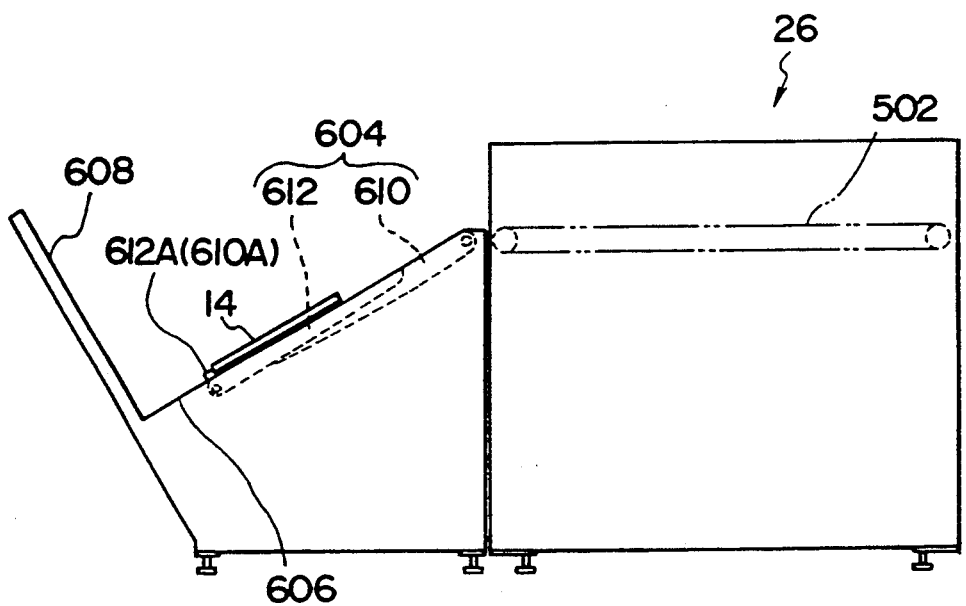
FIG. 18 is a side view illustrating the operation of the accommodating portion.
Figure 19:
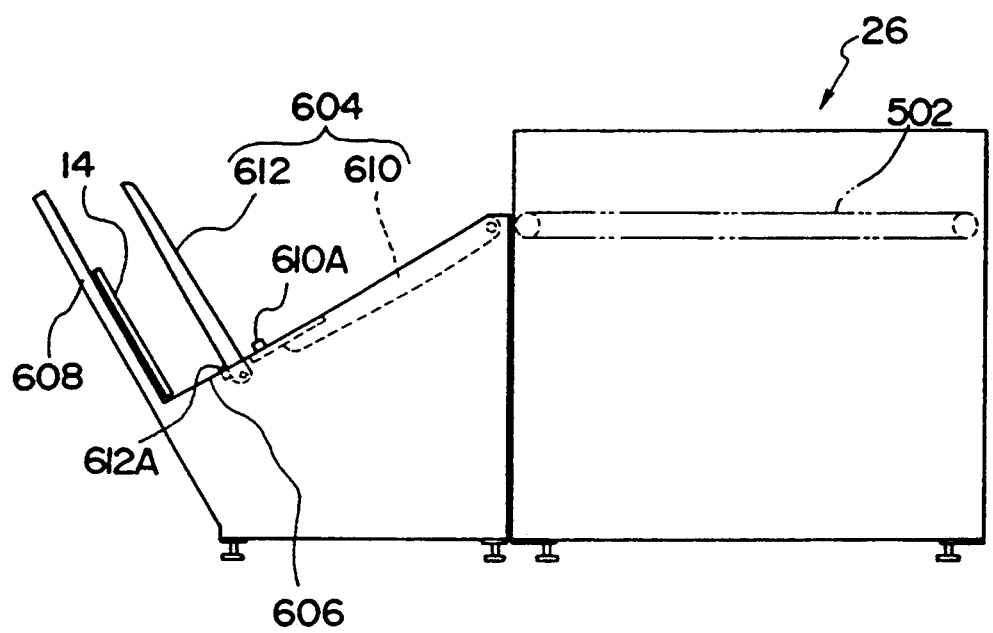
FIG. 19 is a side view illustrating the operation of the accommodating portion.

As shown in FIG. 12, the printing plate direct making apparatus 10 in the first embodiment further comprises the accommodating portion 600 for accommodating the printing plates 14 which are already bent. The accommodating portion 600 comprises a body 602 against which the printing plate 14 is leaned, and a guide device 604 which guides the printing plate 14 to a desired position in the body 602, as shown in FIGS. 17 to 19, the body 602 contains a slope 606 along which the printing plate 14 slides down, and a leaning wall 608 which is provided at right angle to the slope 606. The guide device 604 comprises first arms 610, each pivoted between a horizontal position for receiving the printing plate 14 conveyed by the conveying device 502 of the plate bending section 26 and a slope position for allowing the printing plate 14 to slide down the slope 606 by an unillustrated swinging device, and second arms 612, each pivoted between the slope position inclined along the slope 606 and the leaning position for leaning the slid printing plate 14 against the leaning wall 608 by an unillustrated swinging device. A stopper 610A is provided in the vicinity of the tip end of each first arm 610, while a stopper 612A is provided in the vicinity of the base portion of each second arm 612. These stoppers 610A and 612A prevent the printing plate 14 from sliding down to the base portion of the leaning wall 608 to abut against it, when the first arms 610 which have received the printing plate 14 is swung to the slope positions. Further, these swinging devices are controlled by an unillustrated controlling device.

Accordingly, as shown in FIGS. 17 to 19, the printing plate 14, conveyed by the conveying devices 502 from the plate bending section 26, is received by the first arms 610 at the horizontal positions, and slid down along the slope 606 by swinging the first arms 610 to the slope positions by means of the swinging device. Then, the printing plate 14 is leaned against the leaning wall 608 by moving the second arms from the slope positions to the leaning positions.

The operation of the direct printing plate making apparatus 10 as structured above will be now described.

A large number of printing plates 14 are loaded on the printing plate loading stand 28 which is positioned opposite to the plate supplying section 12. In the plate supplying section 12, the suction cup 44 is operated by the driving mechanism 46. The printing plate 14 of the topmost layer is sucked, accommodated in the supporting angle 48, and passed to the supporting stand 52 by the separating bar 50. Then, the supporting angle 48 is elevated, and the printing plate 14 is sent to the depicting section 16.

The printing plate 14 loaded on the surface plate 55 in the depicting section 16 is pushed and moved in the first direction (i.e., in the widthwise direction of the surface plate 55, i.e., the printing plate 14) by the first pusher 64 of the positioning device, and is caused to abut against the first reference pins 68 for positioning the first direction of the printing plate 14. Then, the printing plate 14 is pushed and moved in the second direction (i.e., in the lengthwise direction of the surface plate 55, i.e., the printing plate 14) by the second pusher 66, and is caused to abut against the second reference pin 70 for positioning the second direction of the printing plate 14. The printing plate 14 thus positioned on the surface plate 55 is sucked onto the surface plate 55 by the suction device (unillustrated). After the suction, the first pusher 64, the second pusher 66, the first reference pins 68, and second reference pin 70, comprising the positioning device, are retracted under the surface plate 55. Then, the surface plate 55, that is, the plate stand 54 is moved toward the depicting device 58 by the moving device 74. While this movement is performed, the printing plate 14 on the surface plate 55 is positive-charged electrically by the corona discharge from the charging device 56. On the printing plate 14 positioned immediately under the depicting device 58, an image is depicted by scanning with the semiconductor laser beam from the depicting device 58. After the image is depicted, the surface plate 55 is moved in the direction opposite to the above-described direction by the moving device 74, and is returned to its original position.

The printing plate 14 processed by the depicting section 16 is removed from the depicting section 16, while the opposite edges are caught up by the unillustrated grasping means. The removed printing plate 14 is sent to the developing process section 18. In the developing process section 18, the printing plate 14 is provided with a liquid toner in the developing portion 86, squeezed to remove unnecessary toner in the squeezing portion 88, and dried in the drying portion 90. In this manner, the developed printing plate 14 is conveyed to the fixing process section 20. In the fixing process section 20, the printing plate 14 is heated and fixed by a fixing lamp in the fixing portion 92. Then, the printing plate 14 is cooled in the cooling portion 94 and dried in the drying portion 96. The printing plate 14 which has been subject to the fixing process is conveyed to the etching section 22. In the etching section 22, the non-imaging area is etched by the alkali solution in the etching portion 98, and then the printing plate 14 is squeezed in the squeezing portion 100 to remove the alkali solution. Furthermore, the printing plate 14 is rinsed in the rinsing portion 102 and coated with the gumming solution in the gumming solution coating portion 104 to protect the surface of the printing plate 14.

The printing plate 14 processed in the etching section 22 is conveyed to the punching section 24 through the waiting portion 106. In the punching section 24, the printing plate 14 is positioned on the surface plate 110 by the positioning device. That is, the printing plate 14 is pushed by the third pusher 202 to abut against the third reference pins 206 for positioning the third direction (i.e., in the widthwise direction of the surface plate 110, i.e., the printing plate), and then pushed by the fourth pusher 204 to abut against the fourth reference pin 208 for positioning the fourth direction (i.e., in the lengthwise direction of the surface plate 110). When the printing plate 14 is positioned in the fourth direction by the fourth pusher 204, the printing plate 14 is moved smoothly in the fourth direction while it is being guided in accordance with the rotation of the abutment members 266 of the third reference pins 206. As a result, the printing plate 14 can be positioned with high accuracy. This positioned printing plate 14 is sucked onto the surface plate 110 by the suction device 300. On the sucked printing plate 14, the round hole and rectangular notch are punched in a lengthwise end by the punching device 400, and the rectangular notch are punched in the other lengthwise end by the punching device 450.

The printing plate 14 punched in the punching section 24 is conveyed to the plate bending section 26 by the conveying devices 122. In the plate bending section 26, the printing plate 14 is positioned on the surface plate 500. That is, the printing plate 14 is pushed by the fifth pusher 504, and its side edges are caused to abut against the fifth reference pins 510 so that the printing plate 14 can be positioned widthwise. Then the printing plate 14 is pushed by the sixth pusher 506, and its side edge is caused to abut against the sixth reference pin 512 so that the printing plate 14 can be positioned lengthwise. The positioned printing plate 14 is sucked onto the surface plate 500 by the unillustrated suction device. The sucked printing plate 14 is bent by the bending device 530. That is, both of the lengthwise edge portions of the printing plate 14 are bent into shapes shown in FIG. 16 by the first mechanism 532 and second mechanism 534. The printing plate 14 which has been subject to the bending process in the plate bending section 26 is conveyed to the accommodating portion 600 by the conveying devices 502. In the accommodating portion 600, the printing plate 14 is guided to the leaning wall 608 of the body 602 by the guide device 604, leaned against the leaning wall 608, and accommodated.

In the first embodiment, the positional relation between the first reference pins 68 and the second reference pin 70 in the depicting section 16, the positional relation between the third reference pins 206 and the fourth reference pin 208 in the punching section 24, and the positional relation between the fifth reference pins 510 and the sixth reference pin 512 in the plate bending section 26 are defined identically. Therefore, in the depicting section 16, the punching section 24, and the plate bending section 26, the first, third and fifth reference pins 68, 206, and 510 are caused to abut against the same side edges of the printing plate 14, while the second, fourth and sixth reference pins 70, 208, and 512 are also caused to abut against the same side edge of the printing plate 14. Accordingly, even if the printing plates 14 have different right angles of their square, the printing plates 14 may be positioned with high accuracy in the depicting section 16, the punching section 24, and the plate bending section 26.

The printing plate 14 in the first embodiment which has been processed in the plate bending section 26 is accommodated in the accommodating portion 600. In this invention, however, the printing plate 14 may be conveyed directly to a piling section for piling the same and wound around the plate cylinder of the rotary press without being accommodated in the accommodating portion 600.

The above embodiment is directed to the printing plate making apparatus for color printing, but this invention, of course, can be applied to a printing plate making apparatus for monochromic printing.

A photosensitive lithographic printing plate (called a PS plate hereafter) making apparatus will now be described as the second embodiment.

Figure 20:
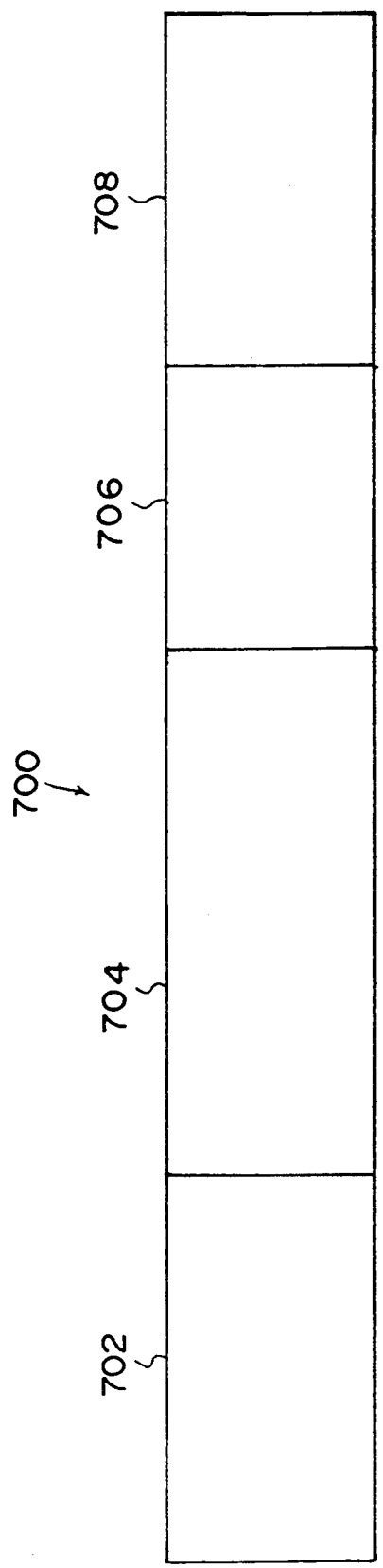
FIG. 20 is a schematic illustration of a photosensitive lithographic printing plate making apparatus in accordance with a second embodiment.

The photosensitive lithographic printing plate making apparatus (called the PS plate making apparatus) 700, as shown in FIG. 20, comprises a printing section 702, a processing section 704, a punching section 706, and a plate bending section 708.

Figure 21:
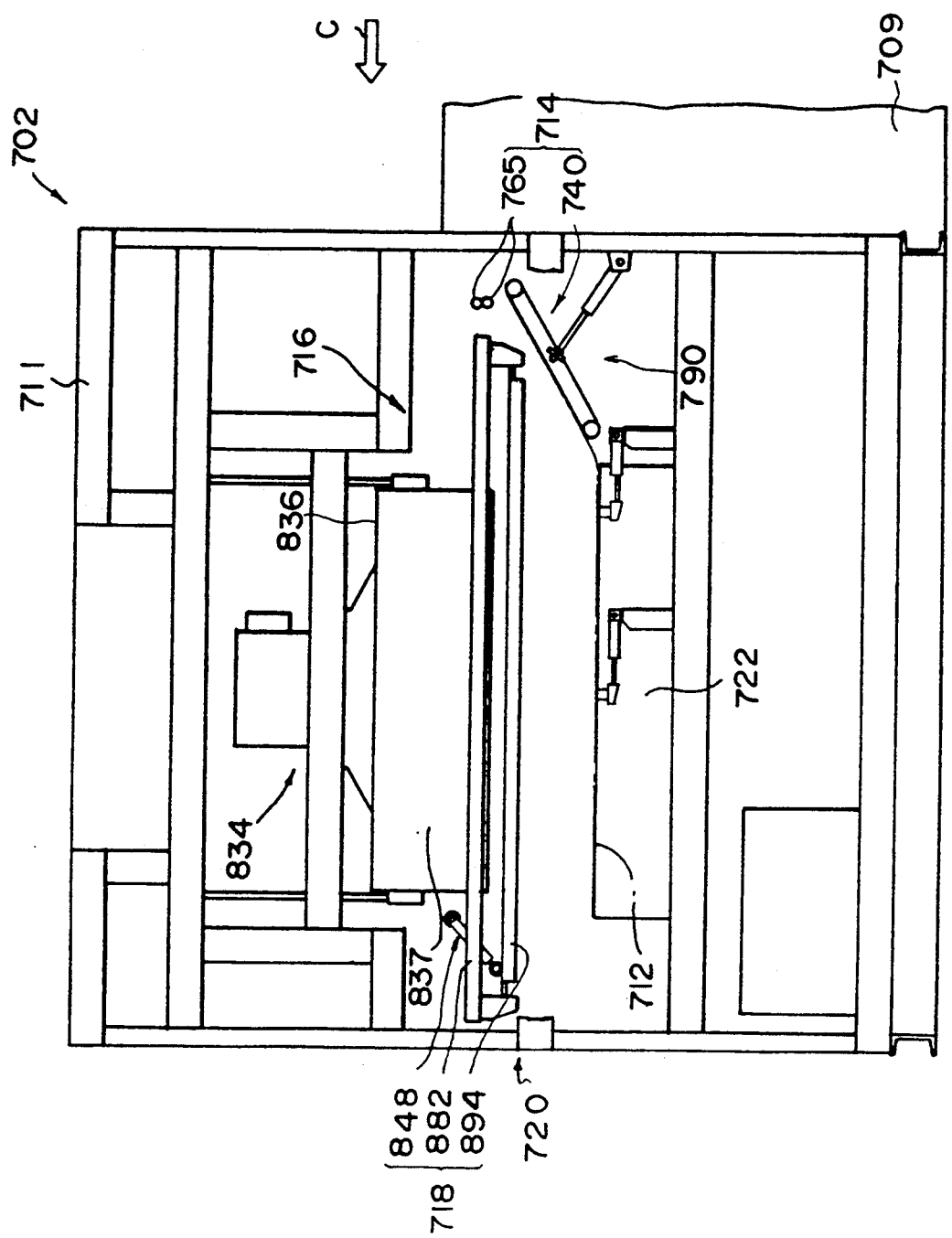
FIG. 21 is a front view of a printing section of the photosensitive lithographic printing plate making apparatus in accordance with the second embodiment.
Figure 22:
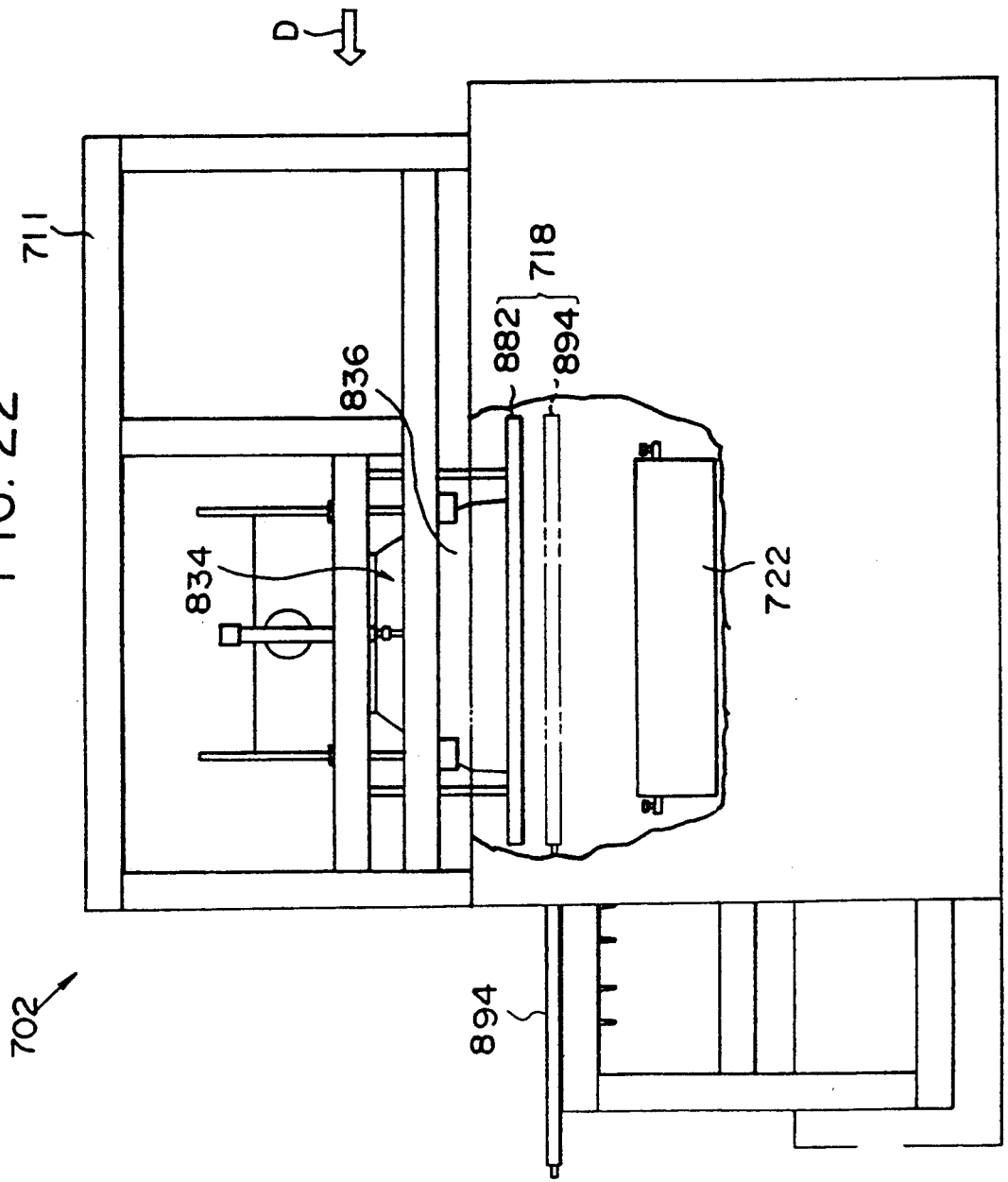
FIG. 22 is a side view of the printing section of the photosensitive lithographic printing plate making apparatus in accordance with the second embodiment.
Figure 23:
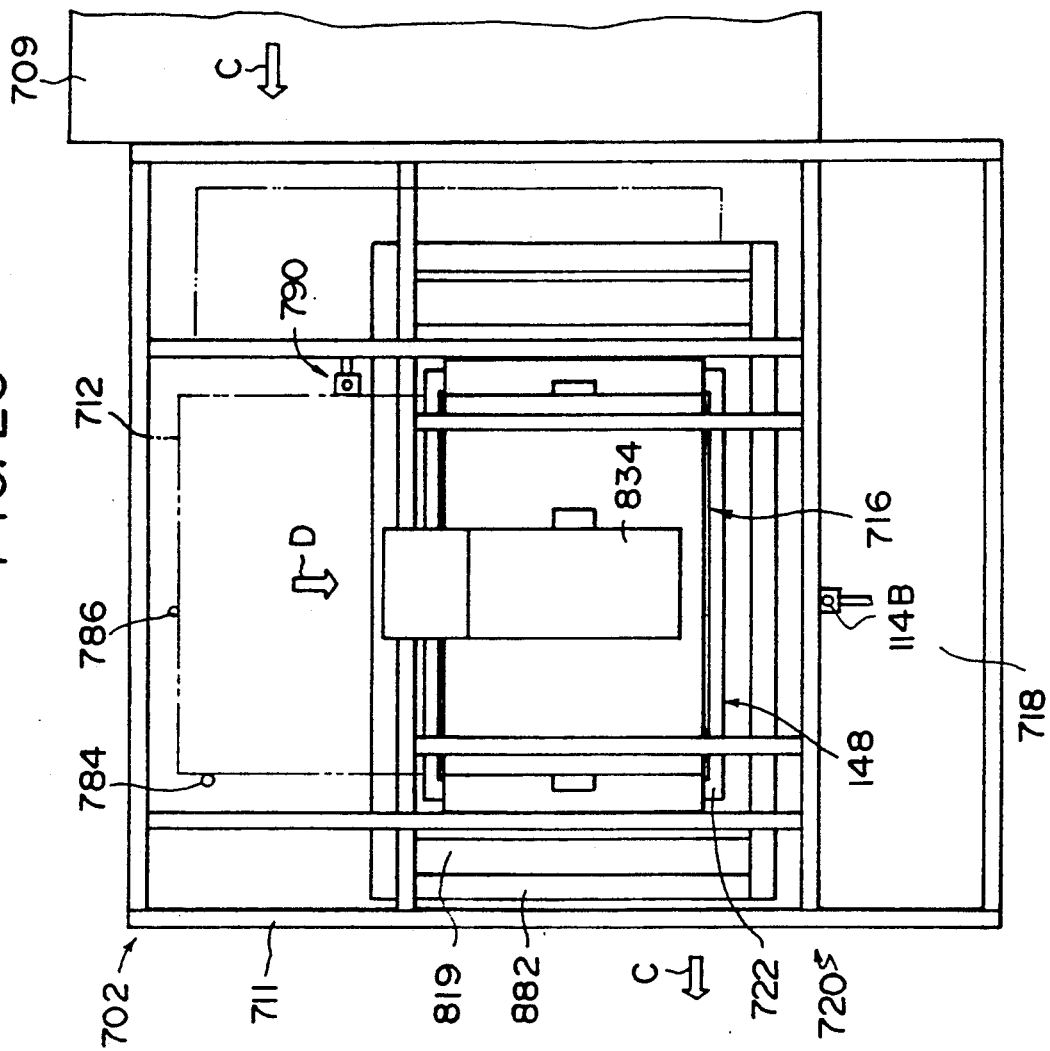
FIG. 23 is a plan view of the printing section of the photosensitive lithographic printing plate making apparatus in accordance with the second embodiment.

The printing, or recording, section 702, as shown in FIGS. 21 to 23, is shaped into a box, and is provided therein with a PS plate supplying portion 714 for supplying a PS plate 712 (see FIG. 23), a surface plate 722 for loading the PS plate 712 supplied from the PS plate supplying portion 714, a printing device 716 for printing the image recorded on a negative film 736 (see FIGS. 26 and 27) onto the PS plate 712, a negative sheet supplying portion 718 for supplying a transparent sheet 725 on which the negative film 736 has been attached (called the negative sheet 724), to a printing device 716, and a PS plate discharging portion 720 for discharging the PS plate 712 on which the image on the negative film 736 has been printed.

Figure 26:
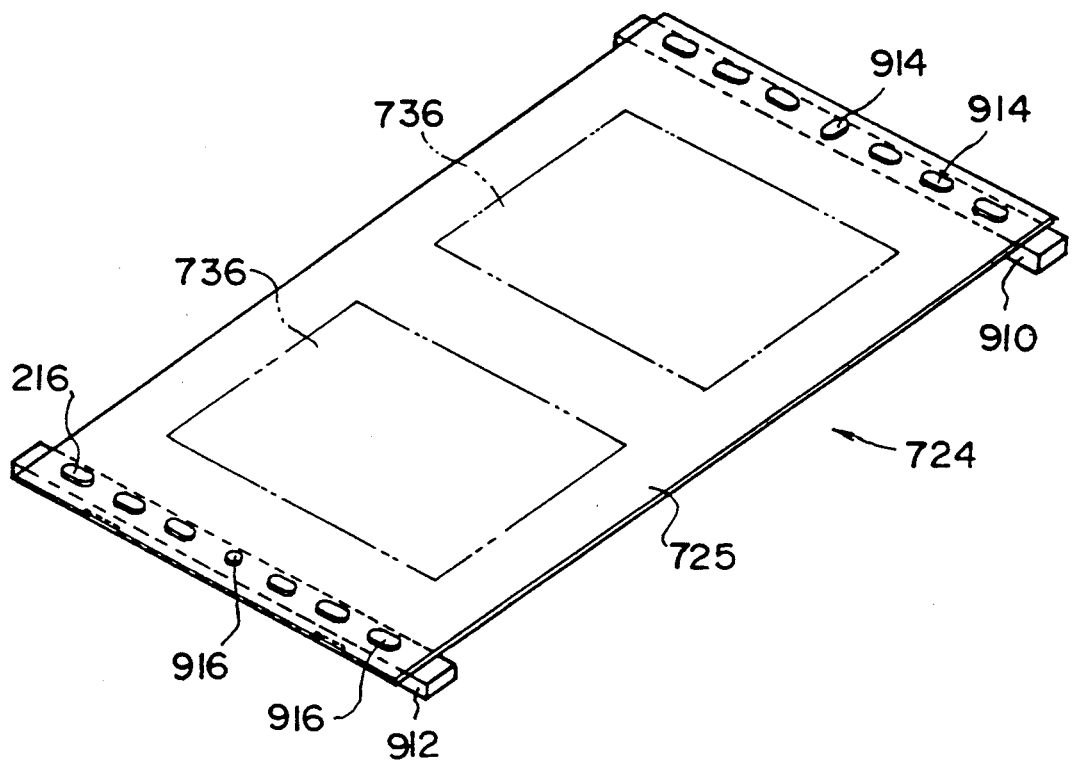
FIG. 26 is a perspective view wherein the negative sheet is set in pin bars.
Figure 27:
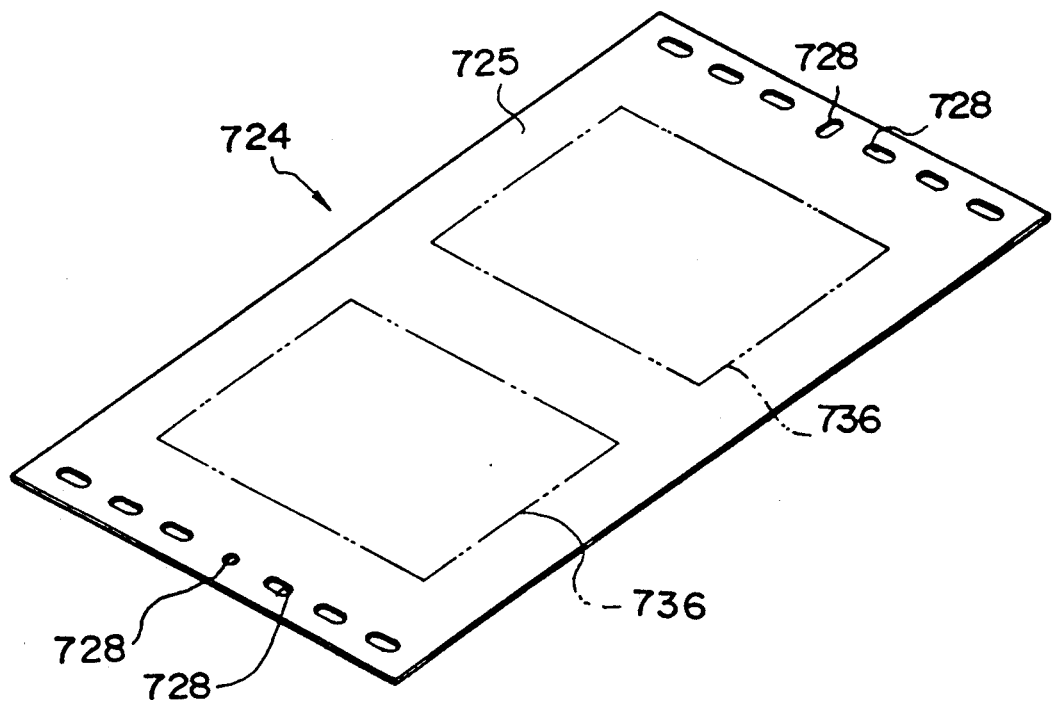
FIG. 27 is a perspective view of the negative sheet.

Referring now to FIGS. 26 and 27, the negative sheet 724 will be described.

The negative sheet 724 is comprised of the thin, rectangular, transparent sheet 725 and the negative film 736 which has been attached on this transparent sheet 725 and on which the image has been recorded. On the transparent sheet 725, a plurality of through holes 728 are provided at given intervals along both of its short sides. As shown in FIG. 26, pins 914 of a pin bar 910 and pins 916 of a pin bar 912 pass through these holes 728. In this case, the negative sheet 724, wherein the negative film 736 (two films for this embodiment) on each of which the image is recorded is attached at a desired position on the transparent sheet 725 with adhesive tape or the like, is prepared.

Using devices structured in the same way as the plate supplying section 12 of the first embodiment, or an automatic feeder 709 constituted so as to be described in Japanese Patent Application Laid-Open No. 63-106245 and Japanese Patent Application Laid-Open No. 63-171728 and so on, the PS plate 712 can be supplied to the PS plate supplying portion 714.

The PS plate supplying portion 714 comprises a pair of conveyor rollers 765 and a plate supplying conveyor 740. The PS plate 712 fed from the automatic feeder 709 is nipped and conveyed to the plate supplying conveyor 740 by the conveying rollers 765. Then, the PS plate 712 is moved on the plate supplying conveyor 740 and sent to the surface plate 722 in the printing section 702.

The PS plate 712, supplied from the PS plate supplying portion 714 to the surface plate 722 and loaded on the surface plate 722 is moved to a desired position on the surface plate 722 by a conveying mechanism such as the unillustrated suction cup, and then positioned by a positioning device.

The positioning device, as well as that of the first embodiment, comprises a pushing means for pushing to move the PS plate 712 on the surface plate 722, and a positioning means for abutting against side edges of the PS plate 712 which is pushed and moved, to positioning the PS plate 712.

Figure 24:
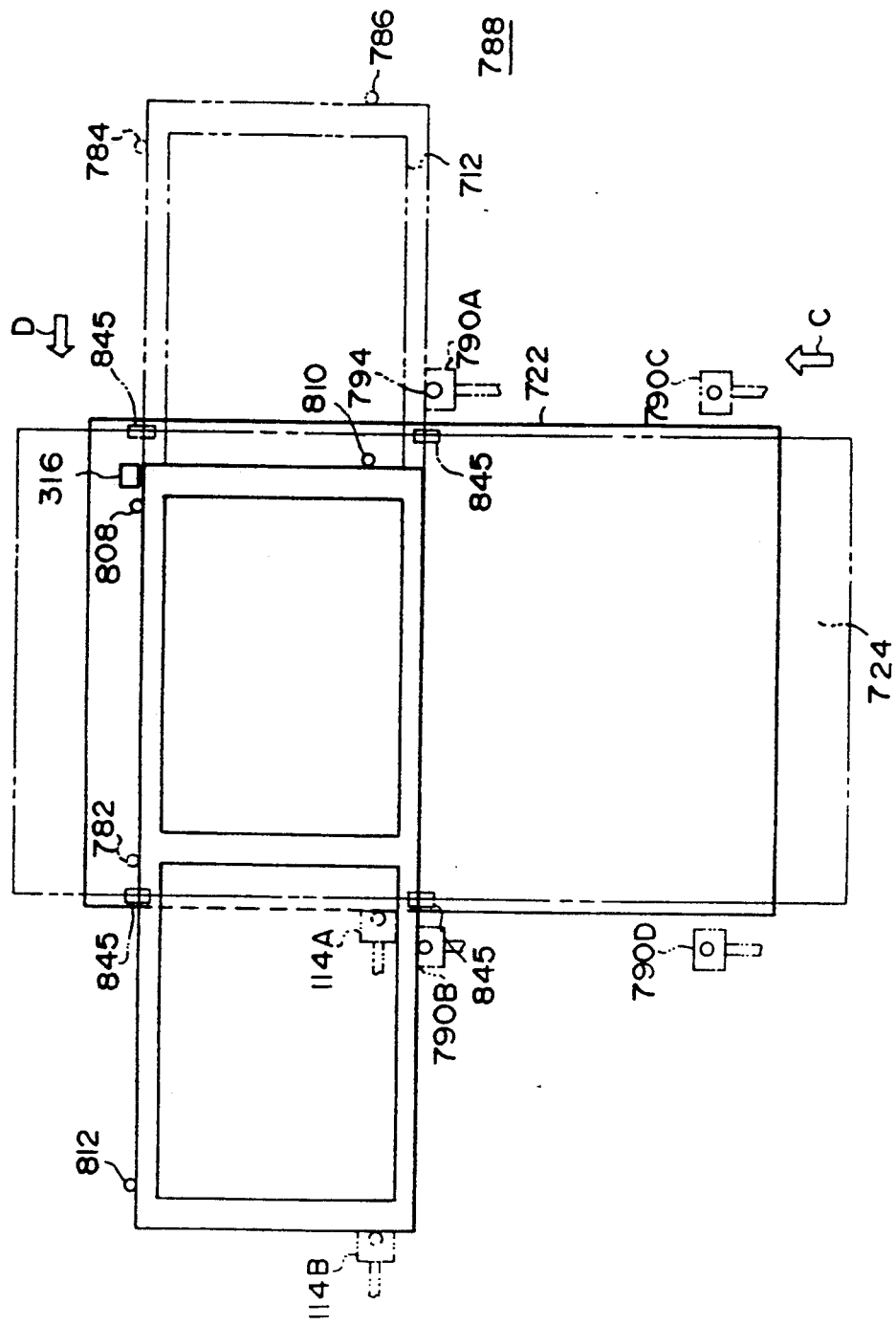
FIG. 24 is a plan view showing the relation between a PS plate on a surface plate and a negative sheet, and the relation between reference pins and pushers.
Figure 25:
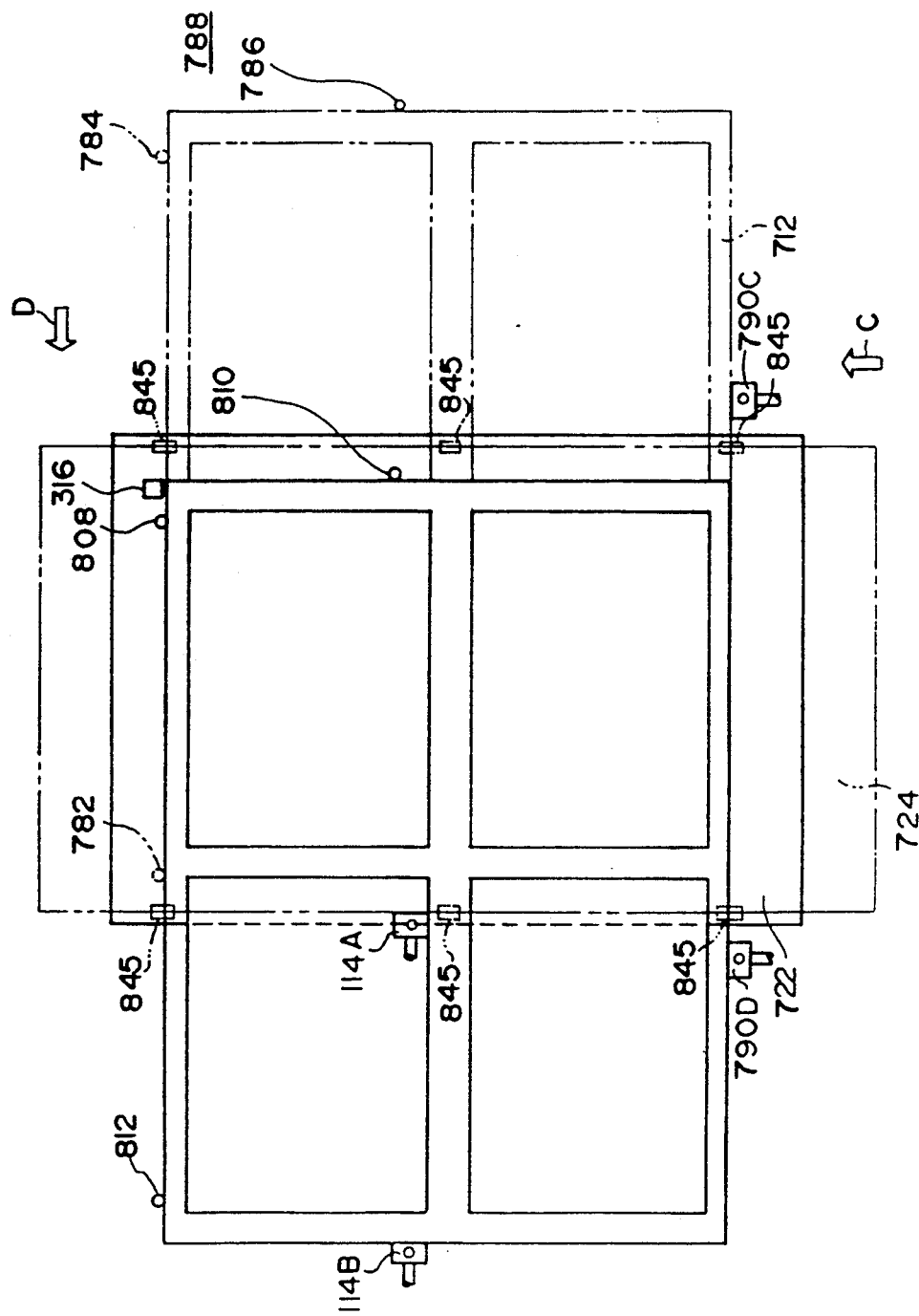
FIG. 25 is a plan view showing the relation between a PS plate on a surface plate and a negative sheet, and the relation between reference pins and pushers.

Referring now to FIGS. 24 and 25, the above described pushing means and positioning means will be described. FIG. 24 shows the PS plate 712 for two pages of a newspaper, while FIG. 25 shows the PS plate 712 for four pages of a newspaper.

The pushing means comprises first pushers 790A, 790B, 790C, and 790D for pushing to move the PS plate 712 in a first direction (i.e. the direction indicated by arrow C in FIG. 24). In FIGS. 24 and 25, the first pushers 790A and 790C are used for positioning when the left-hand imaging area of the printing plate 712 is printed, while the first pushers 790B and 790D are used for positioning when the right-hand imaging area thereof is printed. In addition, the first pushers 790A and 790B are used for pushing the PS plate 712 for two pages of a newspaper, while the first pushers 790C and 790D are used for pushing the PS plate 712 for four pages of a newspaper. The first pushers 790A, 790B, 790C, and 790D, in the same way as the third pusher 202 disclosed in the first embodiment, may comprise an air cylinder, and a rotor for pushing to move the PS plate 712 on the surface plate 722, which is supported by the driving shaft of the air cylinder and elevated from a position lower than the surface of the surface plate 722 due to the projection of the driving shaft. Therefore, the details of these pushers are omitted. In addition, the pushing means includes second pushers 114A and 114B for pushing to move the PS plate 712 in the second direction (i.e., the direction opposite to that indicated by arrow D in FIGS. 24 and 25), which is at a right-angle to the first direction. In addition, the second pusher 114A, in the same way as the third pusher 202 disclosed in the first embodiment, may comprise an air cylinder and a rotor for pushing to move the PS plate 712 on the surface plate 722, which is supported by the driving shaft of the air cylinder and elevated from a position lower than the surface of the surface plate 722 due to the projection of the driving shaft. Therefore, the details of this pusher are omitted. Also, the second pusher 114B may comprise an air cylinder for pushing the PS plate 712 horizontally, which is arranged so that the driving shaft can be projected horizontally, and a rotor for pushing the PS plate 712, which is rotatably mounted in the end of the driving shaft.

The positioning means comprises first reference pins 782, 784, 808, and 812 that are disposed corresponding to the first pushers 790A, 790B, 790C, and 790D. The first reference pins 782 and 784 abut against the PS plate 712 which is pushed to be moved by the first pushers 790A and 790C so as to position the PS plate 712. The first reference pins 808 and 812 abut against the PS plate 712 which is pushed to be moved by the first pushers 790B and 790D so as to position the PS plate 712. In addition, the positioning means comprises second reference pins 786 and 810 corresponding to the second pushers 114A and 114B. The second reference pin 786 abuts against the PS plate 712 which is pushed to be moved by the second pusher 114A so as to position the PS plate 712. The second reference pin 810 abuts against the PS plate 712 which is pushed to be moved by the second pusher 114B so as to position the PS plate 712. The first reference pins 782, 808, and the second reference pin 810 are provided within the surface plate 722, and may be structured in the same way as the third reference pin 206 described in the first embodiment. Thus, the explanation for these pins is omitted. The first reference pins 784, 812, and the second reference pin 786 are arranged on a base 788 outside the surface plate 722, and the top ends of these pins are positioned slightly higher than the surface plate 722. Furthermore, the first reference pins 784, 812, and the second reference pin 786 need not be constituted so as to be projected above the surface plate 722 and retracted. However, it is preferable that the heads of these pins against which the PS plate 712 abuts are constituted in the same way as the third reference pin 206, which is described in the first embodiment, shown in FIG. 10.

Therefore, the positioning of the first direction for the PS plate 712 loaded on the surface plate 722 is accomplished by pressing the PS plate 712 to move it so as to abut against the first reference pins 782, 784, 808, and 812 by the pushing force of the first pushers 790A, 790B, 790C, and 790D. On the other hand, the positioning of the second direction is performed by pressing this plate to move it so as to abut against the second reference pins 786 and 810 by the pushing force of the second pushers 114A and 114B.

The PS plate 712 which has been positioned on the surface plate 722 by the above-structured positioning device is sucked onto the surface plate 722 by an unillustrated suction device. This suction device may be structured substantially the same as the suction device 300 described in the first embodiment.

To the PS plate 712 sucked by the unillustrated suction device, the negative sheet 724 is supplied from the negative sheet supplying portion 718.

The negative sheet supplying portion 718, as shown in FIG. 21, contains a rectangular retaining frame 882 between the surface plate 722 and the printing device 716. The retaining frame 882 is moved to approach to the surface plate 722 and to separate therefrom by a driving device such as an unillustrated cylinder. The retaining frame 882 supports a negative sheet supporting frame 894. The negative sheet supporting frame 894 is a rectangular frame, and the above-described pin bars 910 and 912 are provided inside of the short sides of this frame. One of these pin bars 910 and 912 can be moved along the long sides of the negative sheet supporting frame 894. The negative sheet 724, engaged with the negative frame 894 by the pin bears 910 and 912, is pressed toward the pin bars 910 and 912 by an illustrated pressing member, so that the holes 728 of the negative sheet 724 are prevented from coming out of the pins 914 and 916 on the pin bars 910 and 912. In the printing section 702 the negative sheet supporting frame 894 can be moved toward the width of the surface plate 722 (i.e., in the directions indicated by arrow D and against the direction indicated by arrow D in FIG. 22), and it can be drawn out of the printing section 702, that is, to the position indicated by a solid line in FIG. 22. In the negative sheet supplying portion 718, a squeezing device 848 supported by the retaining frame 882 is disposed. The squeezing device 848 can be moved against the direction indicated by arrow C in FIG. 21, and comprises a squeezing roller for pushing the negative sheet 724 toward the surface plate 722 loaded on the surface plate 722.

Accordingly, after the negative sheet 724 is supported by the pin bars 910 and 912 of the negative sheet supporting frame 894 which has been drawn out of the printing portion 702, the negative sheet supporting frame 894 is pushed into the printing section 702 and supported by the retaining frame 882. In this state, the retaining frame 882 is lowered by the unillustrated driving device, and the negative sheet 724 is positioned on the PS plate 712. Then, the negative sheet 724 is squeezed by the squeezing device 848 and placed in closely contact with the PS plate 712 on the surface plate 722.

Figure 28:
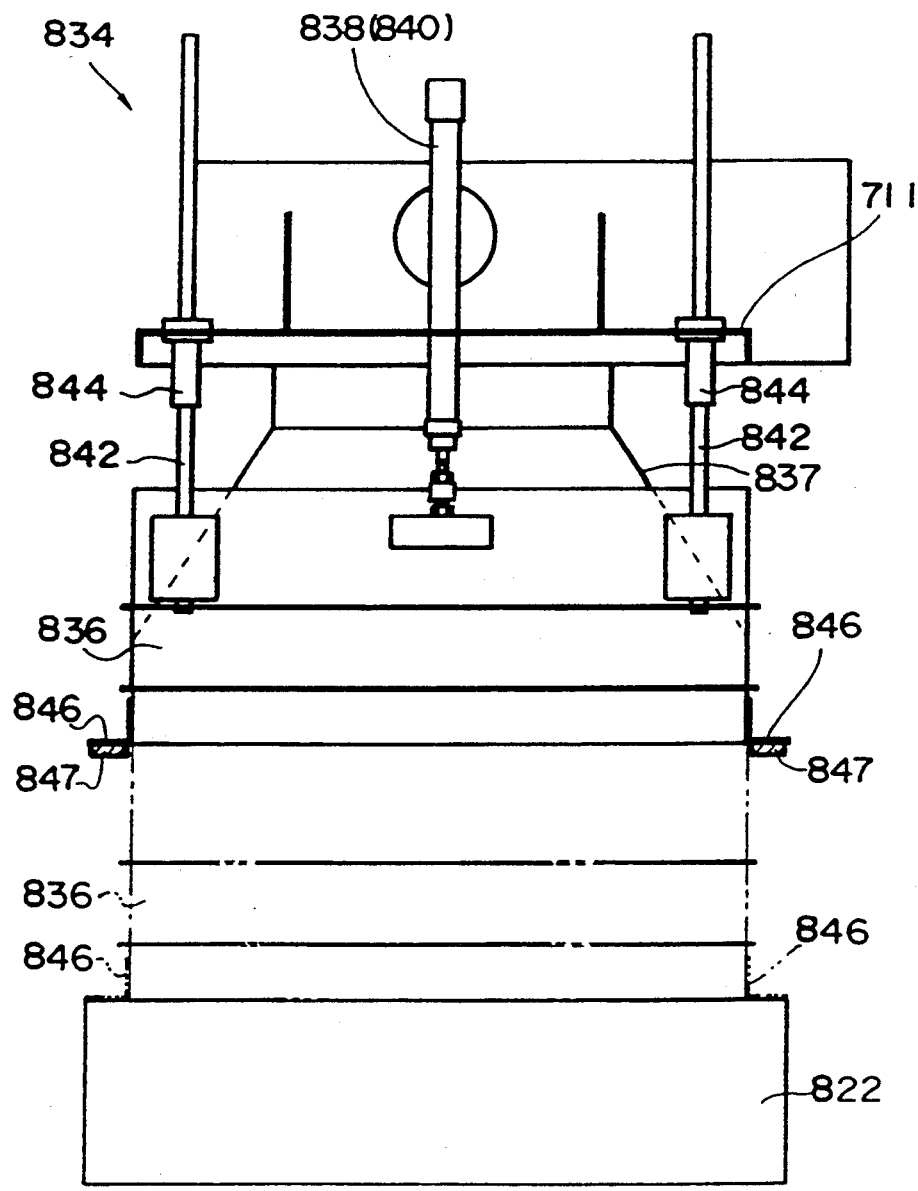
FIG. 28 is a side view illustrating a light source and a light source hood.

In this state, an image on the negative sheet 724 is exposed to the PS plate 712 by the printing device 716. The printing device 716 includes a light source 834 placed above the surface plate 722. As shown in FIG. 28, the light source 834 is covered with a light source hood 836 and reflection hood 837. The light source hood 836 is fixed to the lower ends of the driving shafts of two air cylinders 838 and 840 which are supported by a frame body 711 so as to be suspended from the air cylinders 838 and 840. In addition, (lower) ends of guide bars 842 are connected to the light source hood 836. Each of the guide bar 842 passes through a slide bearing 844 supported by the frame body 711 so as to be guided smoothly for upward or downward movement. Therefore, the light source hood 836 is guided by the guide bars 842 and the slide bearing 844 to be moved up and down smoothly between the position indicated by a solid line and the position indicated by a two-dot chain line in FIG. 28, when the air cylinders 838 and 840 are operated. A pressing members 846 with a L-shaped section is fixed in the lower part of each of the light source hood 836. A hard sponge 847 is fixed to the reverse face of each of the pressing member 846. As shown in FIGS. 24 and 25, the sponge 847 pushes up an overlap portions 845 of the edge of the PS plate 712 on the surface plate 722 with the edge of the negative sheet 724 set on the PS plate 712, when the light source hood 836 is moved down. As a result, there is no cavity formed in the overlap portions 845, so that it is possible to closely contact the PS plate 712 with the negative sheet 724.

Accordingly, the light source hood 836 is moved down to the squeezed negative sheet 724 by the operation of the air cylinders 838 and 840, and the overlap portions 845 are pushed by the pressing members 846, so that the negative sheet 724 contacts the PS plate 712 more closely. Then, an image on the negative film 736 of the negative sheet 724 is exposed, or recorded, on the PS plate 712 by the light source 834.

The PS plate 712 on which an image has been printed, i.e., exposed, is sent to the PS plate discharging portion 720, and is discharged from the printing section 702 by an unillustrated conveying rollers disposed in the PS plate discharging portion 720.

The PS plate 712 on which an image has been printed in the printing section 702 is processed in the processing section 704.

As shown in FIG. 29, the processing section 704 comprises a first developing vessel 901. a second developing vessel 902, and a gumming solution coating vessel 906 arranged subsequent to the second developing vessel 902. The first developing vessel 901 comprises a conveying rollers 914, split rollers 915, brushing rollers 916, bracket rollers 917, squeezing rollers 918, and shower pipes 919 for showering the PS plate 712, which is sent in the direction indicated by arrow E, with a developing solution. The second developing vessel 902 comprises conveying rollers 924, a brushing rollers 926, bracket rollers 927, a squeezing rollers 928, and shower pipes 930 for showering the PS plate 712, which has come from the first developing vessel 901, with a developing solution. The gumming solution coating vessel 906 comprises conveying rollers 934, a split roller 935, squeezing rollers 938, and shower pipes 940 for showering the PS plate 712, which comes from the second developing vessel 902, with a gumming solution. A pump 942 circulates and supplies developing solution from a developing solution storing portion 943 in the first developing vessel 901 to the shower pipes 919. A pump 944 circulates and supplies developing solution from a developing solution storing portion 945 in the second developing vessel 902 to the shower pipes 930. A pump 946 circulates and supplies the gumming solution from a gumming solution tank 947 to the shower pipes 940. A pump 948 feeds developing solution from the developing solution storing portion 945 in the second developing vessel 902 to the developing solution storing portion 943 in the first developing vessel 901, when a valve 949 is opened. A pump 950 pumps up fresh developing solution from a fresh developing solution storing tank 951 to the developing solution storing portion 945 in the second developing vessel 902. A valve 952 is opened for exhausting developing solution in the first developing vessel 901 from the developing solution storing portion 943 to the waste solution recovery tank 953.

In order to supply the developing solution into the first and second developing vessels 901 and 902 in the processing section 704 as structured above, the pump 950 is first operated to feed fresh developing solution from the fresh developing solution storing tank 951 to the second developing vessel 902. Then, the valve 949 is opened to operate the pump 948 while the fresh developing solution is being fed. After the developing solution is fed into the first developing vessel 901 by an adequate amount, the pump 948 is stopped. On the other hand, the gumming solution is preliminarily prepared in the gumming solution tank 947. Under these conditions, the pumps 942 and 944 are operated in order to circulate the developing solution and the pump 946 is operated in order to spray the gumming solution, respectively, and the PS plate 712 is conveyed in the direction indicated by arrow E in FIG. 29. The PS plate 712 is subject to the developing process in the first and second developing vessels 901 and 902, coated with the gumming solution in the gumming solution coating vessel 906 to be formed with a plate surface protecting film, and conveyed out of the processing section 704. If the developing solution is used to the utmost of developing capacity during the developing process in the first and second developing vessels 901 and 902, the pumps 942 and 944 are stopped, and the valve 952 is opened to exhaust the developing solution from the first developing vessel 901 to the waste solution recovery tank 953. After the discharge of the waste solution, the valve 952 is closed. Then, the valve 949 is opened and the pump 948 is operated to pump out the developing solution from the second developing vessel 902 to the first developing vessel 901. After this operation of the pump 948, the valve 949 is closed, and the pump 948 is stopped. In order to supply fresh developing solution from the fresh developing solution storing tank 951 to the second developing vessel 902, the pump 950 is operated. After an adequate quantity of fresh developing solution is fed into the second developing vessel 902, the pump 950 is stopped. In this manner, waste developing solution in the first developing vessel 901 is exhausted, the developing solution in the second developing vessel 902 is sent to the first developing vessel 901, and fresh developing solution is supplied to the second developing vessel 902. On the other hand, as the quantity of the developing solution which the PS plate 712 brings from the second developing vessel 902 to the gumming solution coating vessel 906 is increased, the gumming solution which is circulated between the gumming solution tank and the gumming solution coating vessel 906 through the shower pipes 940 generates solid grains therein because of its combination with the materials dissolved from the PS plate 712 to the developing solution. Therefore, this gumming solution must be replaced by fresh gumming solution.

The PS plate 712 processed in the processing section 704 is conveyed to the punching section 706. The punching section 706 is structured in substantially the same way as the punching section 24 in the first embodiment. That is, the punching section 706 comprises a surface plate, a positioning device, a suction device, and a punching device. The positioning device in the punching section 706 is structured in the same way as the positioning device of the printing section 702. That is, the positional relation of the positioning device to the PS plate 712 is identical to the positional relation of the positioning device in the printing section 702 to the PS plate 712.

The PS plate 712 which has been punched in the section 706 is conveyed to the plate bending section 708. The plate bending section 708 is structured in substantially the same way as the plate bending section 26 in the first embodiment. That is, the plate bending section 708 comprises a surface plate, a conveying device, a positioning device, a suction device, and a bending device. The positioning device in the plate bending section 708 is structured in the same way as the positioning device of the printing portion 702. That is, the positional relation of the positioning device to the PS plate 712 is identical to the positional relation of the positioning device in the printing portion 702 to the PS plate 712. Furthermore, an accommodating portion is provided in the second embodiment in the same way as in the first embodiment.

The operation of the second embodiment as above structured will be now described.

The PS plate 712 is fed into the PS plate supplying portion 714 by the automatic feeder 709, and conveyed to the surface plate 722 by the plate supplying conveyor 740 in the PS plate supplying portion 714. The PS plate 712 conveyed to the surface plate 722 is moved to the desired position on the surface plate 722 by the unillustrated conveying device and positioned by the positioning device. The positioned PS plate 712 is sucked onto the surface plate 722 by the unillustrated suction device. The negative sheet 724, which has been set in the negative frame 894 in the negative sheet supplying portion 718 and supported by the retaining frame 882, is moved down to the PS plate 712, squeezed by the squeezing device 848, and placed in close contact with the PS plate 712. In this state, the light source hood 836 is lowered so that the pressing member 846 presses the overlap portions 845 of the edge of the PS plate 712 with the edge of the negative sheet 724. As a result, the negative sheet 724 is contacted more closely with the PS plate 712. Then, an image on the negative sheet 724 is printed on the PS plate 712 by the light source 834. The PS plate 712 on which an image has been printed is sent to the processing section 704, and is subject to the developing process using the developing solution in the first and second developing vessels 901 and 902 in the processing portion 704. The developed PS plate 712 is coated with the gumming solution in the gumming solution coating vessel 906, and then the plate surface protecting film is formed on the PS plate 712. The PS plate 712 with a gumming coating thereon is conveyed to the punching section 706. In the punching section 706, the PS plate 712 is positioned on the surface plate 722 by the positioning device, sucked onto the surface plate by the suction device, and punched by the punching device. Then, the PS plate 712 is conveyed to the plate bending section 708. In the plate bending section 708, the PS plate 712 is positioned on the surface plate by the positioning device, sucked onto the surface plate by the suction device, and bent by the bending device. The bent PS plate 712 is conveyed to the accommodating portion (unillustrated) by the conveying device.

In the second embodiment, in the same way as the first embodiment, the positional relations of the positioning device to the PS plate 712, that is, the positional relation of the first pushers and the second pushers to the PS plate 712, and the positional relation of the first reference pins and the second reference pins to the PS plate 712, in the printing section 702, the punching section 706, and the plate bending section 708 are defined identically. Therefore, when the PS plate 712 is positioned in the printing section 702, the punching section 706, and the plate bending section 708, the same portions, i.e., side edges, of the PS plate 712 are pushed and the other same portions, i.e., side edges, are caused to abut against the first and second reference pins in these sections, respectively. As a result, the positioning of the PS plate 712 can be performed with high accuracy.

In the above-described embodiments, the apparatuses in which the same positioning is performed in the depicting section or the printing section, the punching section, and the plate bending section has been explained. However, the present invention is not limited to such apparatuses and can also be applied to an apparatus in which the same positioning is performed in the depicting or printing section and the plate bending section.

What is claimed is:

1. A printing plate making method comprising the steps of:
   (a) recording an image on a surface of a printing plate,
   (b) processing said printing plate with a processing solution, while conveying said printing plate on which said image has been recorded,
   (c) punching notches in said printing plate for positioning said plate on and winding said plate around a plate cylinder of a rotary press, and
   (d) bending said printing plate, in which said notches have been punched, to wind said printing plate around said plate cylinder,
   wherein
   said step (a) includes, prior to recording the image, a positioning step of pushing a side edge of said printing plate in a first direction so as to cause said printing plate to abut against a first reference pin, and pushing another side edge of said printing plate in a second direction substantially right-angled to the first direction so as to cause said printing plate to abut against a second reference pin, and said step (c) includes, prior to punching the notches, a positioning step of pushing a side edge of said printing plate in a third direction so as to cause said printing plate to abut against a third reference pin, and pushing another side edge of said printing plate in a fourth direction substantially right-angled to said third direction so as to cause said printing plate to abut against a fourth reference pin, and
   a positional relationship between said first and second reference pins being set to be the same as a positional relationship between said third and fourth reference pins.

2. A printing plate making method for color printing comprising the steps of:
   (a) recording an image on a surface of a printing plate,
   (b) processing said printing plate with a processing solution, while conveying said printing plate on which said image has been recorded,
   (c) punching notches in said printing plate for positioning said plate on and winding said plate around a plate cylinder of a rotary press on said processing printing plate, and
   (d) bending said printing plate, in which said notches have been punched, to wind said printing plate around said plate cylinder,
   wherein
   said step (a) includes, prior to recording the image, a positioning step of pushing a side edge of said printing plate in a first direction so as to cause said printing plate to abut against a first reference pin, and pushing another side edge of said printing plate in a second direction substantially right-angled to the first direction so as to cause said printing plate to abut against a second reference pin, and said step (c) includes, prior to punching the notches, a positioning step of pushing a side edge of said printing plate in a third direction so as to cause said printing plate to abut against a third reference pin, and pushing another side edge of said printing plate in a fourth direction substantially right-angled to said third direction so as to cause said printing plate to abut against a fourth reference pin, and
   a positional relationship between said first and second reference pins being set to be the same as a positional relationship between said third and fourth reference pins.

3. A printing plate making apparatus comprising:
   a recording section provided with a first positioning device for positioning a printing plate, for recording an image on a printing surface of said printing plate which has been positioned by said first positioning device;
   a processing section for processing with a processing solution said printing plate on which said image has been recorded, while conveying said printing plate, and,
   a punching section provided with a second positioning device for positioning said printing plate, for punching positioning notches on said printing plate which has been positioned by said second positioning device for positioning and winding said printing plate around a plate cylinder of a rotary press;
   wherein
   said first positioning device comprises a first reference member for abutting against a side edge of said printing plate being moved in a first direction and positioning said printing plate in said first direction, and a second reference member for abutting against a side edge of said printing plate being moved in a second direction right-angled to said first direction and positioning said printing plate in said second direction, and said second positioning device comprises a third reference member for abutting against a side edge of said printing plate being moved in a third direction and positioning said printing plate in said third direction, and a fourth reference member for abutting against a side edge of said printing plate being moved in a fourth direction right-angled to said third direction and positioning said printing plate in said fourth direction, wherein
   the positional relation between said first and second reference members and the positional relation between said third and fourth reference members are set identically.

4. A printing plate making apparatus according to claim 3, wherein said printing plate is a photosensitive lithographic printing plate.

5. A printing plate making apparatus according to claim 3, wherein said recording section comprises a first surface plate on which said printing plate is loaded, from which said first and second reference members can be projected and retracted, and said punching section comprises a second surface plate on which said printing plate is loaded, from which said third and fourth reference members can be projected and retracted.

6. A printing plate making apparatus according to claim 5, further comprising means for insulating said first and second reference members from said first surface plate, and means for insulating said third and fourth reference members from said second surface plate.

7. A printing plate making apparatus for color printing comprising:
   a recording section, provided with a first positioning device for positioning a printing plate, for recording an image on a printing surface of said printing plate which has been positioned by said first positioning device;
   a processing section for processing with a processing solution said printing plate on which said image has been recorded, while conveying said printing plate, and,
   a punching section, provided with a second positioning device for positioning said printing plate, for punching positioning notches on said printing plate which has been positioned by said second positioning device for positioning and winding said printing plate around a plate cylinder of a rotary press;
   wherein
   said first positioning device comprises a first reference member for abutting against a side edge of said printing plate being moved in a first direction and positioning said printing plate in said first direction, and a second reference member for abutting against a side edge of said printing plate being moved in a second direction right-angled to said first direction and positioning said printing plate in said second direction, and said second positioning device comprises a third reference member for abutting against a side edge of said printing plate being moved in a third direction and positioning said printing plate in said third direction, and a fourth reference member for abutting against a side edge of said printing plate being moved in a fourth direction right-angled to said third direction and positioning said printing plate in said fourth direction, wherein
   the positional relation between said first and second reference members and the positional relation between said third and fourth reference members are set identically.

8. A printing plate making apparatus according to claim 7, wherein said printing plate is a photosensitive lithographic printing plate.

9. A printing plate making apparatus according to claim 7, wherein at least one of said first and second reference members is provided in a plurality of locations, and at least one of said third and fourth reference members is provided in a plurality of locations.

10. A printing plate making apparatus according to claim 7, wherein said first, second, third, and fourth reference members are all reference pins.

11. A printing plate making apparatus according to claim 7, wherein said recording section comprises a first surface plate on which said printing plate is loaded, from which said first and second reference members can be projected and retracted, and said punching section comprises a second surface plate on which said printing plate is loaded, from which said third and fourth reference members can be projected and retracted.

12. A printing plate making apparatus according to claim 11, further comprising means for insulating said first and second reference members from said first surface plate, and means for insulating said third and fourth reference members from said second surface plate.

13. A printing plate making apparatus according to claim 7, wherein said first direction is set substantially identical to said third direction, and said second direction is set substantially identical to said fourth direction.

14. A printing plate making apparatus for color printing comprising:
- a depicting section, provided with a first positioning device for positioning a printing plate, for recording an image on a surface of said printing plate which has been positioned by said first positioning device,
- a processing section for developing, fixing and etching said printing plate, while conveying said printing plate; and
- a punching section, provided with a second positioning device, for punching notches on said printing plate which has been positioned by said second positioning device for positioning and winding said printing plate around a plate cylinder of a rotary press; wherein
- said first positioning device comprises a first reference pin for abutting against a side edge of said printing plate being moved in a first direction and positioning said printing plate in said first direction, and a second reference pin for abutting against a side edge of said printing plate being moved in a second direction right-angled to said first direction and positioning said printing plate in said second direction, and said second positioning device comprises a third reference pin for abutting against a side edge of said printing plate being moved in a third direction and positioning said printing plate in said third direction; and a fourth reference pin for abutting against a side edge of said printing plate being moved in a fourth direction right-angled to said third direction and positioning said printing plate in said fourth direction, wherein
- the positional relation between said first and second reference pins and the positional relation between said third and fourth reference pins are set identically.

15. A printing plate making apparatus according to claim 14, wherein said printing plate is a photosensitive lithographic printing plate.

16. A printing plate making apparatus according to claim 14, wherein at least one of said first and second reference pins is provided in a plurality of locations, and at least one of said third and fourth reference pins is provided in a plurality of locations.

17. A printing plate making apparatus according to claim 14, wherein said depicting section comprises a first surface plate on which said printing plate is loaded, from which said first and second reference pins can be projected and retracted, and said punching section comprises a second surface plate on which said printing plate is loaded, from which said third and fourth reference members can be projected and retracted.

18. A printing plate making apparatus according to claim 17, further comprising means for insulating said first and second reference members from said first surface plate, and means for insulating said third and fourth reference members from said second surface plate.

19. A printing plate making apparatus according to claim 14, wherein said depicting section comprises a charging device for electrically charging said printing plate, and a depicting device for recording an image as an electrostatic latent image on said printing plate by scanning with a laser beam.

20. A printing plate making apparatus according to claim 19, wherein said processing section comprises a developing section for developing, and said developing section is structured so as to apply a liquid toner to said printing plate to develop said electrostatic latent image.

21. A printing plate making apparatus according to claim 14, wherein said first positioning device comprises a first pushing means for pushing said printing plate to move it in said first direction, and a second pushing means for pushing said printing plate to move it in said second direction, and, said second positioning device comprises a third pushing means for pushing said printing plate to move it in said third direction and a fourth pushing means for pushing said printing plate to move it in said fourth direction.

22. A printing plate making apparatus according to claim 14, wherein said first direction is set substantially the same as said third direction, and said second direction is set substantially the same as said fourth direction.

23. An apparatus for producing a photosensitive lithographic printing-plate, comprising:
(1) a printing section for printing an image on said printing plate, said printing section including:
  (1a) a first pushing means for pushing said printing plate in a first direction;
  (1b) a first positioning means for positioning said printing plate in said first direction, said first positioning means further including at least one first reference member for abutting against a side edge of said printing plate and positioning said printing plate in said first direction,
  (1c) a second pushing means for pushing said printing plate in a second direction, and
  (1d) a second positioning means for positioning said printing plate in said second direction, said second positioning means further including at least one second reference member for abutting against a side edge of said printing plate and positioning said printing plate in said second direction,
(2) a processing section for developing said image printed on said printing plate in said printing section;
(3) a punching section for punching notches in said printing plate on which said image has been developed, said punching section including:
  (3a) a third pushing means for pushing said photosensitive lithographic printing plate in a third direction;

(3b) a third positioning means for positioning said photosensitive lithographic printing plate in said third direction, said third positioning means further including at least one third reference member for abutting against a side edge of said printing plate and positioning said printing plate in said third direction;

(3c) a fourth pushing means for pushing said photosensitive lithographic printing plate in a fourth direction, and (3d) a fourth positioning means for positioning said photosensitive lithographic printing plate in said fourth direction, said fourth positioning means further including at least one fourth reference member for abutting against a side edge of said printing plate and positioning said printing plate in said fourth direction; and, (4) a plate bending section for bending said printing plate on which said notches have been punched, wherein a positional relationship between said first and second reference members is identical to the positional relationship between said third and fourth reference members.

24. An apparatus according to claim 23, wherein said printing section further includes:
    a printing device;
    a negative sheet supplying means for supplying a negative sheet, said negative sheet including a transparent sheet with a negative film containing an image, to said printing device, said negative sheet supplying means being positioned below said printing device;
    a printing plate supplying means for supplying said printing plate;
    a surface plate on which said printing plate supplied from said printing plate supplying means is loaded, said surface plate being positioned below said negative sheet supplying means; and
    a discharging means for discharging said printing plate from said printing section.

25. An apparatus according to claim 24, wherein said printing device comprises:
    a light source;
    a light source hood
    a reflection hood;
    at least one pressing member fixed to a lower side of said light source hood; and
    a driving means for lowering and raising said printing device.

26. An apparatus according to claim 24, wherein said negative sheet supplying means comprises:
    a retaining frame;
    a negative sheet supporting frame;
    a squeezing device; and
    a driving means for lowering and raising said negative sheet supplying means between said printing device and said surface plate.

27. An apparatus according to claim 24, wherein said printing plate supplying means comprises:
    a pair of conveyor rollers; and
    a plate supplying conveyor.

28. An apparatus according to claim 23, wherein said processing section includes:
    a first developing vessel, said first developing vessel further including at least one conveying roller, at least one split roller, at least one brushing roller, at least one bracket roller, at least one squeezing roller, and at least one shower pipe;
    a second developing vessel, said second developing vessel further including at least one conveying roller, at least one brushing roller, at least one bracket roller, at least one squeezing roller, and at least one shower pipe;
    a gumming solution coating vessel, said gumming solution coating vessel further including at least one conveying roller, at least one split roller, at least one squeezing roller, and at least one shower pipe;
    a fresh developing solution storing tank;
    a waste developing solution recovery tank; and
    a gumming solution tank.

29. An apparatus according to claim 28, comprising:
    a first pump for circulating and supplying developing solution from said first developing vessel to said at least one shower pipe in said first developing vessel;
    a second pump for circulating and supplying developing solution from said second developing vessel to said at least one shower pipe in said second developing vessel;
    a third pump for circulating and supplying gumming solution from said gumming solution tank to said at least one shower pipe in said gumming solution coating vessel;
    a fourth pump for feeding developing solution from said fresh developing solution storing tank to said second developing vessel; and,
    a fifth pump for feeding developing solution in said second developing vessel to said first developing vessel.

* * * * *